US012701889B2

(12) United States Patent
Ji et al.

(10) Patent No.: US 12,701,889 B2
(45) Date of Patent: Aug. 4, 2026

(54) DISPLAY DEVICE

(71) Applicant: Samsung Display Co., Ltd., Yongin-si (KR)

(72) Inventors: Wooman Ji, Yongin-si (KR);
Keunchan Oh, Yongin-si (KR);
Sunkyu Joo, Yongin-si (KR); Minjae Kim, Yongin-si (KR); Jaecheol Park, Yongin-si (KR); Dokyung Youn, Yongin-si (KR); Changhun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 668 days.

(21) Appl. No.: 18/091,582

(22) Filed: Dec. 30, 2022

(65) Prior Publication Data

US 2023/0217774 A1    Jul. 6, 2023

(30) Foreign Application Priority Data

Jan. 3, 2022    (KR) ........................ 10-2022-0000507

(51) Int. Cl.
H10K 59/38        (2023.01)
H10K 59/80        (2023.01)

(52) U.S. Cl.
CPC ........... H10K 59/38 (2023.02); H10K 59/879 (2023.02)

(58) Field of Classification Search
CPC .... H10K 59/38; H10K 59/879; H10K 59/872; H10K 50/84; H10K 50/858; H10K 59/122; H10K 59/35; G02F 1/133514
See application file for complete search history.

(56) References Cited

U.S. PATENT DOCUMENTS

| | | | |
|---|---|---|---|
| 10,473,985 B2 | 11/2019 | Kim et al. | |
| 11,805,666 B2 | 10/2023 | Kim et al. | |
| 2013/0057812 A1 | 3/2013 | Kwak et al. | |
| 2016/0079311 A1* | 3/2016 | Lim ...................... | H10K 59/35 257/40 |
| 2021/0109400 A1 | 4/2021 | Kim et al. | |
| 2022/0085114 A1 | 3/2022 | Seong et al. | |
| 2022/0157893 A1* | 5/2022 | Baek .................... | H10K 50/858 |

(Continued)

FOREIGN PATENT DOCUMENTS

| | | | |
|---|---|---|---|
| CN | 104865741 | 8/2015 | |
| CN | 104865741 A * | 8/2015 | ....... G02F 1/133512 |

(Continued)

OTHER PUBLICATIONS

Translation of Peng (CN-104865741-A), "Liquid Crystal Panel" (Year: 2015).*

*Primary Examiner* — Jacob Y Choi
*Assistant Examiner* — Ashley Nicole Blackwell
(74) *Attorney, Agent, or Firm* — CANTOR COLBURN LLP

(57) ABSTRACT

A display device includes an edge color filter part disposed on an edge of a substrate, the edge color filter part including at least two stacked edge color filters; and a refractive layer disposed on the edge color filter part. At least one of the edge color filter part and the refractive layer includes a concave or convex portion, and the other one of the at least one of the edge color filter part and the refractive layer includes a protrusion inserted into the concave or convex portion.

23 Claims, 11 Drawing Sheets

(56) References Cited

U.S. PATENT DOCUMENTS

| 2022/0173168 A1* | 6/2022 | Kim | H10K 59/38 |
| 2022/0181589 A1* | 6/2022 | Lim | H10K 59/873 |

FOREIGN PATENT DOCUMENTS

| KR | 10-2013-0027189 | | 3/2013 |
| KR | 1020170038596 | A | 4/2017 |
| KR | 1020170080215 | A | 7/2017 |
| KR | 10-2018-0012915 | | 2/2018 |
| KR | 1020190075553 | A | 7/2019 |
| KR | 10-2020-0083879 | | 7/2020 |
| KR | 10-2021-0043064 | | 4/2021 |
| KR | 1020210151304 | A | 12/2021 |

* cited by examiner

DISPLAY DEVICE

CROSS-REFERENCE TO RELATED APPLICATION(S)

This application claims priority to and benefits of Korean Patent Application No. 10-2022-0000507, filed on Jan. 3, 2022, in the Korean Intellectual Property Office, the entire contents of which are incorporated herein by reference.

BACKGROUND

1. Technical Field

One or more embodiments relate to a display device.

2. Description of the Related Art

Mobile electronic devices are widely used. As mobile electronic devices, not only small electronic devices such as mobile phones but also tablet personal computers (PCs) have been widely used in recent years.

Such mobile electronic devices include display devices to provide various functions and to provide visual information such as images or videos to users. Recently, as other parts for driving display devices have been miniaturized, the proportion occupied by display devices in electronic devices has gradually been increasing. A structure that is bendable to have a certain angle from a flat state is also under development.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In general, in the case of a display device including a color filter, various layers may be formed to realize sharpness of an image implemented in the display device. In case that moisture penetrates into some layers, the lifespan of the display device may be reduced. One or more embodiments include a display device with an increased lifespan.

Additional aspects will be set forth in part in the description which follows and, in part, will be apparent from the description, or may be learned by practice of the presented embodiments of the disclosure.

According to one or more embodiments, a display device may include an edge color filter part disposed on an edge of a substrate, the edge color filter part including at least two stacked edge color filters; and a refractive layer disposed on the edge color filter part, wherein at least one of the edge color filter part and the refractive layer may include a concave or convex portion, and the other one of the at least one of the edge color filter part and the refractive layer may include a protrusion inserted into the concave or convex portion.

In an embodiment, the edge color filter part may include at least one insertion groove into which the protrusion may be inserted.

In an embodiment, the at least one insertion groove may include insertion grooves spaced apart from each other, and a first width of one insertion groove among the at least one insertion groove may be different from a second width of another insertion groove among the at least one insertion groove.

In an embodiment, the first width may be greater than the second width.

In an embodiment, the at least one insertion groove having the first width among the insertion grooves may be disposed closer to an end of the substrate than the another insertion groove having the second width among the insertion grooves.

In an embodiment, the at least one insertion groove may form a single closed-loop in a plan view.

In an embodiment, the refractive layer overlapping the concave or convex portion of the edge color filter part in a plan view may contact different edge color filters.

In an embodiment, the edge color filter part may include a first edge color filter disposed on the substrate and disposed on the edge of the substrate; and a second edge color filter disposed on the first edge color filter, the second edge color filter including the concave or convex portion.

In an embodiment, the first edge color filter may transmit blue light, and the second edge color filter may transmit red light.

In an embodiment, the edge color filter part may include a first edge color filter disposed on the substrate and disposed on the edge of the substrate; a second edge color filter disposed on the first edge color filter, and a third edge color filter disposed on the second edge color filter, the third edge color filter including a concave or convex portion.

In an embodiment, the first edge color filter may transmit blue light, the second edge color filter may transmit red light, and the third edge color filter may transmit green light.

In an embodiment, the display device may further include a capping layer disposed on the refractive layer.

In an embodiment, the display device may further include a bank layer disposed on the refractive layer.

According to one or more embodiments, a display device may include an edge color filter part disposed on an edge of a substrate, the edge color filter part including at least two stacked edge color filters; and a refractive layer disposed on the edge color filter part, wherein the refractive layer disposed on the edge color filter part may include portions of different thicknesses.

In an embodiment, the refractive layer may include a first portion having a first thickness; and a second portion having a second thickness different from the first thickness and connected to the first portion of the refractive layer.

In an embodiment, the edge color filter part may include an accommodation groove in which the first portion is accommodated.

In an embodiment, the first portion may include first portions, and a first width of one first portion among the first portions in a first direction may be different from a second width of another first portion among the plural first portions.

In an embodiment, the first width may be greater than the second width.

In an embodiment, the one first portion having the first width among the plural first portions may be disposed closer to an end of the substrate than the another first portion among the plural first portions having the second width.

In an embodiment, the first portion may form a closed loop in a plan view.

In an embodiment, the display device may further include a capping layer disposed on the refractive layer.

In an embodiment, the edge color filter part may include a first edge color filter disposed on the substrate and disposed on the edge of the substrate; and a second edge color filter disposed on the first edge color filter, the second edge color filter including a concave or convex portion.

In an embodiment, the edge color filter part may include a first edge color filter disposed on the substrate and disposed on the edge of the substrate; a second edge color filter disposed on the first edge color filter; and a third edge color filter disposed on the second edge color filter, the third edge color filter including a concave or convex portion.

Other aspects, features, and advantages of the disclosure will become better understood through the accompanying drawings, the claims, and the detailed description.

BRIEF DESCRIPTION OF THE DRAWINGS

The above and other aspects, features, and advantages of embodiments of the disclosure will be more apparent from the following description taken in conjunction with the accompanying drawings, in which:

FIG. 4 is a schematic cross-sectional view of the display device taken along line B-B' of FIG. 1, according to an embodiment;

FIG. 8 is a schematic cross-sectional view schematically illustrating a display device according to an embodiment;

FIG. 10 is a schematic cross-sectional view schematically illustrating a display device according to an embodiment.

DETAILED DESCRIPTION OF THE EMBODIMENTS

Figure 1:
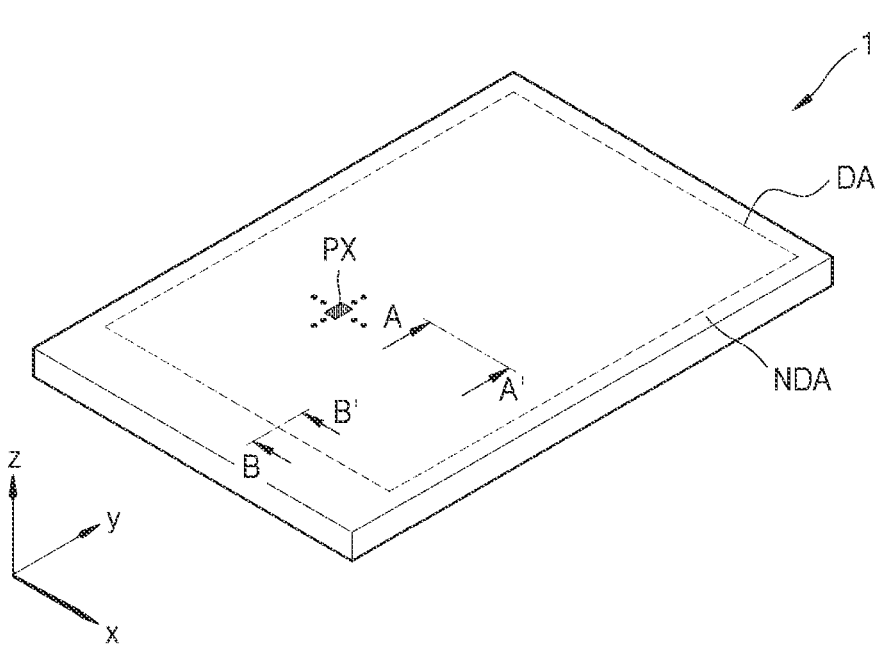
FIG. 1 is a schematic perspective view schematically illustrating a display device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are described below, by referring to the figures, to explain aspects of the description.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b and c" indicates only a, only b, only c, both a and b, both a and c, both b and c, all of a, b, and c, or variations thereof.

As the description allows for various changes and numerous embodiments, embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second" etc. may be used herein to describe various elements, these elements should not be limited by these terms. These terms are only used to distinguish one element from another. For example, a first element may be referred to as a second element, and similarly, a second element may be referred to as a first element without departing from the scope of the disclosure.

The singular forms "a," "an," and "the" as used herein are intended to include the plural forms as well unless the context clearly indicates otherwise.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or element is referred to as being "on" another layer, region, or element, it may be directly or indirectly on the other layer, region, or element. That is, for example, intervening layers, regions, or elements may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view schematically illustrating a display device 1 according to an embodiment.

Referring to FIG. 1, the display device 1 may include a display area DA in which an image is implemented and a non-display area NDA in which an image is not implemented. The display device 1 may provide an image to the outside by using light emitted from the display area DA.

FIG. 1 illustrates the display device 1 in which the display area DA has a rectangular shape, but in an embodiment, the display area DA may have a circular shape, an elliptical shape, or a polygonal shape such as a triangular shape or a pentagonal shape. As the display device 1, a flat-panel display device is illustrated in FIG. 1, but the display device 1 may be implemented in various forms such as flexible, foldable, or rollable display devices. It is to be understood that the shapes disclosed herein may also include shapes substantial to the shapes disclosed herein.

In an embodiment, the display device 1 may be an organic light-emitting display device. In an embodiment, the display device 1 may be an inorganic light-emitting display device or a quantum dot light-emitting display device. For example, an emission layer of a display element included in the display device 1 may include an organic material, an inorganic material, or quantum dots, may include an organic material and quantum dots, may include an inorganic material and quantum dots, or may include an organic material, an inorganic material, and quantum dots. Hereinafter, for convenience of description, a case in which the display device 1 is an organic light-emitting display device will be described in detail.

Pixels PX may be arranged (or disposed) in the display area DA. In the specification, the pixels PX refer to sub-pixels that emit light of different colors from each other. The pixels PX may each be, for example, one of a red sub-pixel, a green sub-pixel, and a blue sub-pixel.

Figure 2A:
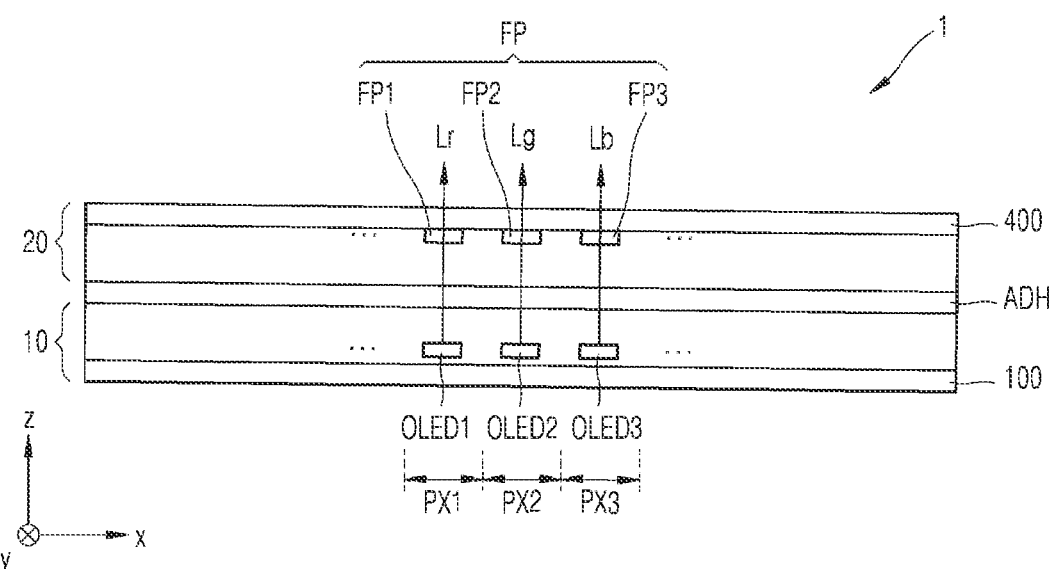
FIG. 2A is a schematic cross-sectional view schematically illustrating a display device according to an embodiment.

FIG. 2A is a schematic cross-sectional view schematically illustrating a display device 1 according to an embodiment.

Referring to FIG. 2A, the display device 1 may include a first pixel PX1, a second pixel PX2, and a third pixel PX3. The first pixel PX1, the second pixel PX2, and the third pixel PX3 may emit pieces of light of different colors from each other. For example, the first pixel PX1 may emit red light Lr, the second pixel PX2 may emit green light Lg, and the third pixel PX3 may emit blue light Lb.

In an embodiment, the display device 1 may include a display panel 10 and a color conversion panel 20. The display panel 10 may include a lower substrate 100 and a display element. The display element may be, for example, an organic light-emitting diode. In an embodiment, the first pixel PX1, the second pixel PX2, and the third pixel PX3 may each include an organic light-emitting diode. For example, the first pixel PX1 may include a first organic light-emitting diode OLED1. The second pixel PX2 may include a second organic light-emitting diode OLED2. The third pixel PX3 may include a third organic light-emitting diode OLED3.

In an embodiment, the first organic light-emitting diode OLED1, the second organic light-emitting diode OLED2, and the third organic light-emitting diode OLED3 may emit blue light. In an embodiment, the first organic light-emitting diode OLED1, the second organic light-emitting diode OLED2, and the third organic light-emitting diode OLED3 may emit the red light Lr, the green light Lg, and the blue light Lb, respectively.

The color conversion panel 20 may include an upper substrate 400 and a filter part FP. In an embodiment, the filter part FP may include a first filter part FP1, a second filter part FP2, and a third filter part FP3. Light emitted from the first organic light-emitting diode OLED1 may be emitted as the red light Lr through the first filter part FP1. Light emitted from the second organic light-emitting diode OLED2 may be emitted as the green light Lg through the second filter part FP2. Light emitted from the third organic light-emitting diode OLED3 may be emitted as the blue light Lb through the third filter part FP3.

In an embodiment, the filter part FP may include a functional layer and a color filter layer. In an embodiment, the functional layer may include a first quantum dot layer, a second quantum dot layer, and a transmission layer. In an embodiment, the color filter layer may include a first color filter, a second color filter, and a third color filter. The first filter part FP1 may include the first quantum dot layer and the first color filter. The second filter part FP2 may include the second quantum dot layer and the second color filter. The third filter part FP3 may include the transmission layer and the third color filter.

The filter part FP may be located (or disposed) on or directly disposed on the upper substrate 400. At this time, the phrase "located directly on the upper substrate 400" may mean that the color conversion panel 20 is manufactured by directly forming the first color filter, the second color filter, and the third color filter on the upper substrate 400. Thereafter, the color conversion panel 20 may be bonded to the display panel 10 so that the first filter part FP1, the second filter part FP2, and the third filter part FP3 face the first organic light-emitting diode OLED1, the second organic light-emitting diode OLED2, and the third organic light-emitting diode OLED3, respectively.

FIG. 2A illustrates that the display panel 10 is bonded to the color conversion panel 20 through an adhesive layer ADH. The adhesive layer ADH may be, for example, an optical clear adhesive (OCA) layer. In an embodiment, the display panel 10 may be bonded to the color conversion panel 20 through a filler. The filler may include an organic material such as methyl silicone, phenyl silicone, or poly-imide. However, the disclosure is not limited thereto, and the filler may include an organic sealant such as a urethane-based resin, an epoxy-based resin, and an acrylic resin, or an inorganic sealant such as silicone. In an embodiment, the adhesive layer ADH and the filler may be omitted.

Figure 2B:
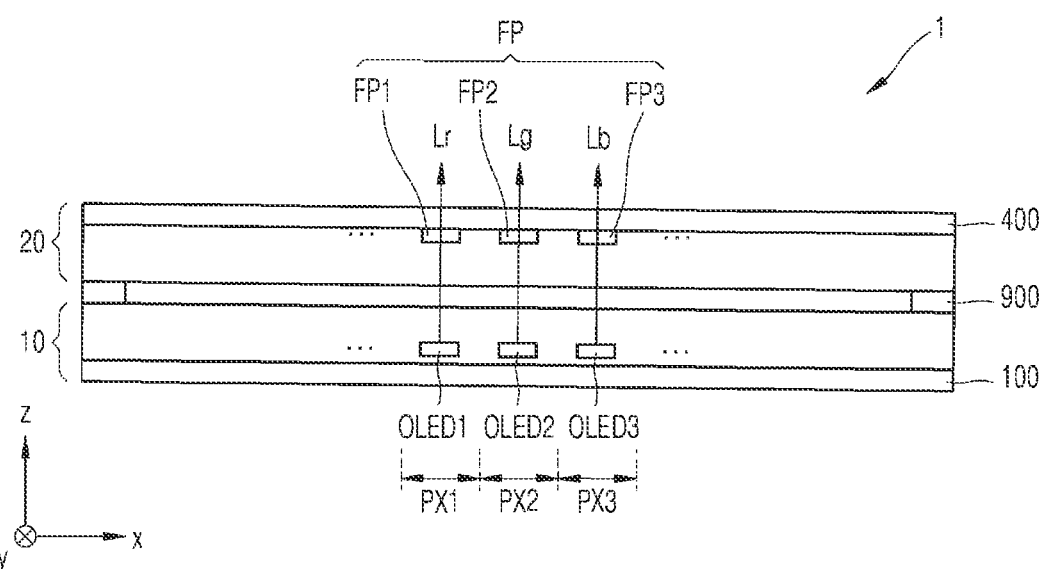
FIG. 2B is a schematic cross-sectional view schematically illustrating a display device according to an embodiment.

FIG. 2B is a schematic cross-sectional view schematically illustrating a display device 1 according to an embodiment.

Referring to FIG. 2B, the display device 1 may include a display panel 10 and a color conversion panel 20. The display panel 10 may include a lower substrate 100 and a display element. Because the display panel 10 and the color conversion panel 20 are the same as or similar to those described with reference to FIG. 2A, a detailed description thereof is omitted. Hereinafter, parts different from those of FIG. 2A will be described in detail.

The display panel 10 and the color conversion panel 20 may be connected to each other through a sealing part 900. The sealing part 900 may be disposed to surround a display area of the display panel 10. For example, in a plan view, the sealing part 900 may be arranged outside the display area, and may form a closed loop. The sealing part 900 and the color conversion panel 20 may completely block the display area from the outside. The sealing part 900 may include a sealant, frit, or the like within the spirit and the scope of the disclosure.

In the case of the above-described structure, a separate filler may be between the color conversion panel 20 and the display panel 10, as illustrated in FIG. 2A.

Figure 3:
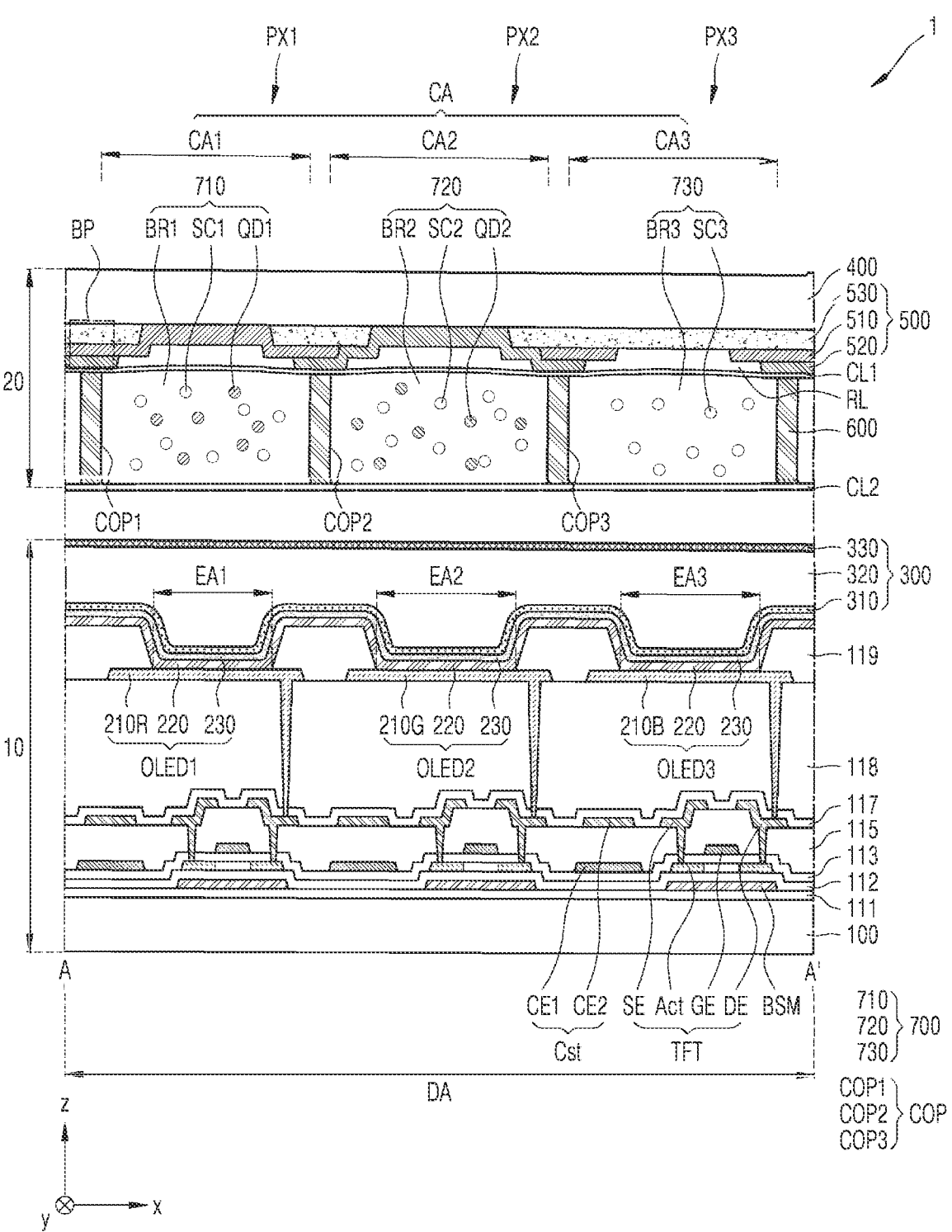
FIG. 3 is a schematic cross-sectional view of the display device taken along line A-A' of FIG. 1, according to an embodiment.

FIG. 3 is a schematic cross-sectional view of the display device 1 taken along line A-A' of FIG. 1, according to an embodiment.

Referring to FIG. 3, the display device 1 may include a first pixel PX1, a second pixel PX2, and a third pixel PX3, which are disposed in a display area DA. Of course, this is only an example, and the display device 1 may include more pixels. FIG. 3 illustrates that the first pixel PX1, the second pixel PX2, and the third pixel PX3 are adjacent to each other, but in an embodiment, the first pixel PX1, the second pixel PX2, and the third pixel PX3 may not be adjacent to each other.

The first pixel PX1, the second pixel PX2, and the third pixel PX3 may implement pieces of light of different colors from each other. For example, the first pixel PX1, the second pixel PX2, and the third pixel PX3 may implement red light, green light, and blue light, respectively.

In an embodiment, the display device 1 may include a display panel 10 and a color conversion panel 20. The display panel 10 may include a lower substrate 100, and a display element disposed on the lower substrate 100. The display element may include an emission layer 220. In an embodiment, the display panel 10 may include a first organic light-emitting diode OLED1, a second organic light-emitting diode OLED2, and a third organic light-emitting diode OLED3, which are disposed on the lower substrate 100. The first organic light-emitting diode OLED1, the second organic light-emitting diode OLED2, and the third organic light-emitting diode OLED3 may each include the emission layer 220.

Hereinafter, the stack structure of the display panel 10 will be described in detail.

The lower substrate 100 may include a glass material, a ceramic material, a metal material, or a flexible or bendable material. In case that the lower substrate 100 is flexible or bendable, the lower substrate 100 may include a polymer resin such as polyethersulfone, polyacrylate, polyetherim-ide, polyethylene naphthalate, polyethylene terephthalate, polyphenylene sulfide, polyarylate, polyimide, polycarbon-ate, or cellulose acetate propionate. The lower substrate 100 may have a single-layer or multi-layer structure including the above-described material. In case that the lower substrate 100 has a multi-layer structure, the lower substrate 100 may further include an inorganic layer. In an embodiment, the lower substrate 100 may have an organic material/inorganic material/organic material structure.

A barrier layer (not illustrated) may be further between the lower substrate 100 and a first buffer layer 111. The barrier layer may prevent or minimize infiltration of impu-rities from the lower substrate 100 into a semiconductor layer Act. The barrier layer may include an inorganic mate-rial such as an oxide or a nitride, an organic material, or an organic/inorganic composite material, and may have a single-layer or multi-layer structure including an inorganic material and an organic material.

A bias electrode BSM may be disposed on the first buffer layer 111 to correspond to a thin-film transistor TFT. In an embodiment, a voltage may be applied to the bias electrode BSM. The bias electrode BSM may prevent external light from reaching the semiconductor layer Act. Accordingly, characteristics of the thin-film transistor TFT may be stabi-lized. On the other hand, the bias electrode BSM may be omitted in some cases.

The semiconductor layer Act may be disposed on a second buffer layer 112. The semiconductor layer Act of the thin-film transistor TFT may include amorphous silicon or polysilicon. In an embodiment, the semiconductor layer Act may include an oxide of at least one selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer Act may include a Zn oxide-based material such as Zn oxide, In—Zn oxide, or Ga—In—Zn oxide. In an embodi-ment, the semiconductor layer Act may include In—Ga—Zn—O (IGZO), In—Sn—Zn—O (ITZO), or In—Ga—Sn—Zn—O (IGTZO) semiconductor, in which a metal such as indium (In), gallium (Ga), or tin (Sn) is included in ZnO. The semiconductor layer Act may include a channel region, and a source region and a drain region arranged on both sides of the channel region. The semiconductor layer Act may include a single layer or layers.

A gate electrode GE may be disposed on the semiconductor layer Act with a gate insulating layer 113 therebetween. The gate electrode GE may at least partially overlap the semiconductor layer Act. The gate electrode GE may include molybdenum (Mo), aluminum (Al), copper (Cu), titanium (Ti), and the like, and may include a single layer or layers. For example, the gate electrode GE may be a single Mo layer. A first electrode CE1 of a storage capacitor Cst and the gate electrode GE may be arranged on a same layer. The first electrode CE1 and the gate electrode GE may include a same material or a similar material.

Although FIG. 3 illustrates that the gate electrode GE of the thin-film transistor TFT and the first electrode CE1 of the storage capacitor Cst are separately arranged, the storage capacitor Cst may overlap the thin-film transistor TFT. The gate electrode GE of the thin-film transistor TFT may function as the first electrode CE1 of the storage capacitor Cst.

An interlayer insulating layer 115 may be provided to cover or overlap the gate electrode GE of the thin-film transistor TFT and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A second electrode CE2 of the storage capacitor Cst and a source electrode SE and a drain electrode DE of the thin-film transistor TFT may be disposed on the interlayer insulating layer 115.

The second electrode CE2 of the storage capacitor Cst and the source electrode SE and the drain electrode DE of the thin-film transistor TFT may include a conductive material including molybdenum (Mo), aluminum (Al), copper (Cu), titanium (Ti), and the like, and may include a single layer or layers including the above-described conductive material. For example, the second electrode CE2, the source electrode SE, and the drain electrode DE may each have a multi-layer structure of Ti/Al/Ti. The source electrode SE and the drain electrode DE may be respectively connected to the source region or the drain region of the semiconductor layer Act through contact holes.

The second electrode CE2 of the storage capacitor Cst may overlap the first electrode CE1 with the interlayer insulating layer 115 therebetween to form the storage capacitor Cst. The interlayer insulating layer 115 may function as a dielectric layer of the storage capacitor Cst.

A wiring protection layer 117 may be disposed on the second electrode CE2 of the storage capacitor Cst and the source electrode SE and the drain electrode DE of the thin-film transistor TFT. The wiring protection layer 117 may include an inorganic insulating material such as silicon nitride, silicon oxide, and/or silicon oxynitride. The wiring protection layer 117 may prevent a wiring, which may include a metal (for example, copper, etc.) that may be damaged by an etchant, from being exposed to an etching environment in a process of manufacturing a display device 1.

A planarization layer 118 may be disposed on the wiring protection layer 117. The planarization layer 118 may include a single layer or layers including an organic material, and may provide a flat upper surface. The planarization layer 118 may include general-purpose polymer (for example, benzocyclobutene (BCB), polyimide, hexamethyldisiloxane (HMIDSO), polymethylmethacrylate (PMMA), or polystyrene (PS)), polymer derivatives having a phenolic group, acrylic polymer, imide polymer, aryl ether polymer, amide polymer, fluorine polymer, p-xylene polymer, vinyl alcohol polymer, and/or any blend thereof.

The display element may be disposed on the planarization layer 118. In an embodiment, the first organic light-emitting diode OLED1, the second organic light-emitting diode OLED2, and the third organic light-emitting diode OLED3 may be disposed on the planarization layer 118. The first organic light-emitting diode OLED1, the second organic light-emitting diode OLED2, and the third organic light-emitting diode OLED3 may include a first pixel electrode 210R, a second pixel electrode 210G, and a third pixel electrode 210B, respectively. In an embodiment, the first organic light-emitting diode OLED1, the second organic light-emitting diode OLED2, and the third organic light-emitting diode OLED3 may commonly include an emission layer 220 and an opposite electrode 230.

The first pixel electrode 210R, the second pixel electrode 210G, and the third pixel electrode 210B may be a (semi) transmissive electrode or a reflective electrode. In an embodiment, the first pixel electrode 210R, the second pixel electrode 210G, and the third pixel electrode 210B may include a reflective layer including Ag, Mg, Al, Pt, Pd, Au, Ni, Nd, Ir, Cr, and any compound thereof, and a transparent or semitransparent electrode layer disposed on the reflective layer. The transparent or semitransparent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). In an embodiment, the first pixel electrode 210R, the second pixel electrode 210G, and the third pixel electrode 210B may include ITO/Ag/ITO.

A pixel defining layer 119 may be disposed on the planarization layer 118. The pixel defining layer 119 may include openings respectively exposing central portions of the first pixel electrode 210R, the second pixel electrode 210G, and the third pixel electrode 210B. The pixel defining layer 119 may cover or overlap edges of the first pixel electrode 210R, the second pixel electrode 210G, and the third pixel electrode 210B. The pixel defining layer 119 may prevent an electric arc or the like from occurring on the edges of the first pixel electrode 210R, the second pixel electrode 210G, and the third pixel electrode 210B by increasing the distance between the edges of the first pixel electrode 210R, the second pixel electrode 210G, and the third pixel electrode 210B and the opposite electrode 230 on the first pixel electrode 210R, the second pixel electrode 210G, and the third pixel electrode 210B.

The pixel defining layer 119 may include at least one organic insulating material selected from polyimide, polyamide, acrylic resin, BCB, and phenol resin, and may be formed by spin coating.

The emission layers 220 of the first organic light-emitting diode OLED1, the second organic light-emitting diode OLED2, and the third organic light-emitting diode OLED3 may include an organic material including a fluorescent or phosphorescent material that emits red light, green light, blue light, or white light. The emission layer 220 may include a low molecular weight organic material or a high molecular weight organic material. Functional layers such as a hole transport layer (HTL), a hole injection layer (HIL), an electron transport layer (ETL), and an electron injection layer (EIL) may be further optionally disposed below and above the emission layer 220. FIG. 3 illustrates that the emission layers 220 are integrally provided over the first pixel electrode 210R, the second pixel electrode 210G, and the third pixel electrode 210B, but the disclosure is not limited thereto, and various modifications may be made thereto. For example, the emission layers 220 may be disposed to correspond to the first pixel electrode 210R, the second pixel electrode 210G, and the third pixel electrode 210B.

The emission layers 220 may include an integral layer over the first pixel electrode 210R, the second pixel electrode 210G, and the third pixel electrode 210B, as described above, but in case that necessary, the emission layers 220 may include a layer patterned to correspond to the first pixel electrode 210R, the second pixel electrode 210G, and the third pixel electrode 210B. In any case, the emission layer 220 may be a first color emission layer. The first color emission layer may be integrally provided over the first pixel electrode 210R, the second pixel electrode 210G, and the third pixel electrode 210B, but in case that necessary, the first color emission layer may be patterned to correspond to the first pixel electrode 210R, the second pixel electrode 210G, and the third pixel electrode 210B. The first color emission layer may emit light of a first wavelength band, for example, light of a wavelength belonging to a range of about 450 nm to about 495 nm.

The opposite electrode 230 may be disposed on the emission layer 220 to correspond to the first pixel electrode 210R, the second pixel electrode 210G, and the third pixel electrode 210B. The opposite electrode 230 may be integrally provided in organic light-emitting elements. In an embodiment, the opposite electrode 230 may be a transparent or semitransparent electrode, and may include a metal thin-film having a low work function and including Li, Ca, LiF/Ca, LiF/Al, Al, Ag, Mg, and/or any compound thereof. A transparent conductive oxide (TCO) layer such as ITO, IZO, ZnO, or $In_2O_3$ may be further disposed on the metal thin-film.

In an embodiment, first light may be emitted from a first emission area EA1 of the first organic light-emitting diode OLED1 to the outside. The first emission area EA1 may be defined as a portion of the first pixel electrode 210R exposed by the opening of the pixel defining layer 119. Second light may be emitted from a second emission area EA2 of the second organic light-emitting diode OLED2 to the outside. The second emission area EA2 may be defined as a portion of the second pixel electrode 210G exposed by the opening of the pixel defining layer 119. Third light may be emitted from a third emission area EA3 of the third organic light-emitting diode OLED3 to the outside. The third emission area EA3 may be defined as a portion of the third pixel electrode 210B exposed by the opening of the pixel defining layer 119.

The first emission area EA1, the second emission area EA2, and the third emission area EA3 may be apart from each other. Areas of the display area DA other than the first emission area EA1, the second emission area EA2, and the third emission area EA3 may be non-emission areas. The first emission area EA1, the second emission area EA2, and the third emission area EA3 may be defined by the non-emission areas. In a plan view, the first emission area EA1, the second emission area EA2, and the third emission area EA3 may be arranged in various arrangements, such as a stripe arrangement or a PENTILE™ arrangement. In a plan view, the first emission area EA1, the second emission area EA2, and the third emission area EA3 may have a polygonal shape, a circular shape, or an elliptical shape.

A spacer (not illustrated) may be further included on the pixel defining layer 119 so as to prevent mask indent. The spacer may be integral with the pixel defining layer 119. For example, the spacer and the pixel defining layer 119 may be simultaneously formed in a same process by using a halftone mask process.

Because the first organic light-emitting diode OLED1, the second organic light-emitting diode OLED2, and the third organic light-emitting diode OLED3 may be readily damaged by external moisture or oxygen, the first organic light-emitting diode OLED1, the second organic light-emitting diode OLED2, and the third organic light-emitting diode OLED3 may be protected by being covered with or overlapped by an encapsulation layer 300. The encapsulation layer 300 may cover or overlap the display area DA, and may extend to the outside of the display area DA. The encapsulation layer 300 may include at least one organic encapsulation layer and at least one inorganic encapsulation layer. For example, the encapsulation layer 300 may include a first inorganic encapsulation layer 310, an organic encapsulation layer 320, and a second inorganic encapsulation layer 330.

Because the first inorganic encapsulation layer 310 is formed along a structure therebelow, the upper surface of the first inorganic encapsulation layer 310 may not be flat. The organic encapsulation layer 320 may cover or overlap the first inorganic encapsulation layer 310. Unlike the first inorganic encapsulation layer 310, the upper surface of the organic encapsulation layer 320 may be substantially flat.

The first inorganic encapsulation layer 310 and the second inorganic encapsulation layer 330 may include at least one inorganic material selected from aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SiON). The organic encapsulation layer 320 may include a polymer-based material. The polymer-based material may include an acrylic resin, an epoxy resin, polyimide, polyethylene, and the like within the spirit and the scope of the disclosure. In an embodiment, the organic encapsulation layer 320 may include acrylate.

Even in case that cracks occur in the encapsulation layer 300 through the multi-layer structure described above, the encapsulation layer 300 may prevent such cracks from being connected to each other between the first inorganic encapsulation layer 310 and the organic encapsulation layer 320 or between the organic encapsulation layer 320 and the second inorganic encapsulation layer 330. Therefore, it is possible to prevent or minimize formation of a path through which external moisture or oxygen penetrates into the display area DA.

Although not illustrated, in case that necessary, other layers such as a capping layer may be between the first inorganic encapsulation layer 310 and the opposite electrode 230.

The color conversion panel 20 may include an upper substrate 400, a color filter layer 500, a refractive layer RL, a first capping layer CL1, a bank layer 600, a functional layer 700, and a second capping layer CL2. The upper substrate 400 may be disposed over the lower substrate 100, so that the display element is between the upper substrate 400 and the lower substrate 100. The upper substrate 400 may be disposed on the first organic light-emitting diode OLED1, the second organic light-emitting diode OLED2, and the third organic light-emitting diode OLED3.

The upper substrate 400 may include a central area CA overlapping the display element. In an embodiment, the central area CA may include a first central area CA1, a second central area CA2, and a third central area CA3. The first central area CA1 may overlap the first organic light-emitting diode OLED1 and/or the first emission area EA1. The second central area CA2 may overlap the second organic light-emitting diode OLED2 and/or the second emission area EA2. The third central area CA3 may overlap the third organic light-emitting diode OLED3 and/or the third emission area EA3.

The upper substrate 400 may include glass, metal, or polymer resin. In case that the upper substrate 400 is flexible or bendable, the upper substrate 400 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. In an embodiment, the upper substrate 400 may have a multi-layer structure including two layers, which include the above-described polymer resin, and a barrier layer, which may include an inorganic material such as silicon oxide ($SiO_2$), silicon nitride ($SiN_x$), or silicon oxynitride (SiON) between the two layers.

The color filter layer 500 may be disposed on the lower surface of the upper substrate 400 in a direction from the upper substrate 400 to the lower substrate 100. The color filter layer 500 may include a first color filter 510, a second color filter 520, and a third color filter 530. The first color filter 510 may be arranged in the first central area CA1. The second color filter 520 may be arranged in the second central area CA2. The third color filter 530 may be arranged in the third central area CA3. The first color filter 510, the second color filter 520, and the third color filter 530 may include a photosensitive resin material. The first color filter 510, the second color filter 520, and the third color filter 530 may include dyes of unique colors. The first color filter 510 may pass only light of a wavelength belonging to a range of about 630 nm to about 780 nm, the second color filter 520 may pass only light of a wavelength belonging to a range of about 495 nm to about 570 nm, and the third color filter 530 may pass only light of a wavelength belonging to a range of about 450 nm to about 495 nm.

The color filter layer 500 may reduce external light reflection of the display device 1. For example, in case that external light reaches the first color filter 510, only light of a preset wavelength may pass through the first color filter 510, as described above, and light of the other wavelengths may be absorbed by the first color filter 510. Accordingly, only the light of the preset wavelength among pieces of external light incident on the display device 1 may pass through the first color filter 510, and a portion thereof may be reflected from the opposite electrode 230 and/or the first pixel electrode 210R therebelow and emitted back to the outside. Because only a portion of the external light incident on a location of the first pixel PX1 is reflected to the outside, the first color filter 510 may reduce external light reflection. This description may also be applied to the second color filter 520 and the third color filter 530.

The first color filter 510, the second color filter 520, and the third color filter 530 may overlap each other. The first color filter 510, the second color filter 520, and the third color filter 530 may overlap each other between one of the central areas CA and another of the central areas CA. For example, the first color filter 510, the second color filter 520, and the third color filter 530 may overlap each other between the first central area CA1 and the second central area CA2. The third color filter 530 may be between the first central area CA1 and the second central area CA2. The first color filter 510 may extend from the first central area CA1 and overlap the third color filter 530. The second color filter 520 may extend from the second central area CA2 and overlap the third color filter 530.

The first color filter 510, the second color filter 520, and the third color filter 530 may overlap each other between the second central area CA2 and the third central area CA3. The first color filter 510 may be between the second central area CA2 and the third central area CA3. The second color filter 520 may extend from the second central area CA2 and overlap the first color filter 510. The third color filter 530 may extend from the third central area CA3 and overlap the first color filter 510.

The first color filter 510, the second color filter 520, and the third color filter 530 may overlap each other between the third central area CA3 and the first central area CA1. The second color filter 520 may be between the third central area CA3 and the first central area CA1. The third color filter 530 may extend from the third central area CA3 and overlap the second color filter 520. The first color filter 510 may extend from the first central area CA1 and overlap the second color filter 520.

As described above, the first color filter 510, the second color filter 520, and the third color filter 530 may overlap each other to define a light blocking part BP. Accordingly, the color filter layer 500 may prevent or reduce color mixing without a separate light blocking member.

In an embodiment, the third color filter 530 may be stacked first on the upper substrate 400. This is because the third color filter 530 may partially absorb external light incident from the outside of the upper substrate 400 to reduce the reflectance of the display device 1, and a user hardly recognizes light reflected by the third color filter 530.

The refractive layer RL may be arranged in the central area CA. The refractive layer RL may be disposed in each of the first central area CA1, the second central area CA2, and the third central area CA3. The refractive layer RL may include an organic material. In an embodiment, the refractive index of the refractive layer RL may be less than the refractive index of the first capping layer CL1. In an embodiment, the refractive index of the refractive layer RL may be less than the refractive index of the color filter layer 500. Accordingly, the refractive layer RL may condense light.

The first capping layer CL1 may be disposed on the refractive layer RL and the color filter layer 500. In an embodiment, the first capping layer CL1 may be between the color filter layer 500 and the functional layer 700. The first capping layer CL1 may protect the refractive layer RL and the color filter layer 500. The first capping layer CL1 may prevent or reduce damage or contamination of the refractive layer RL and/or the color filter layer 500 due to infiltration of impurities such as external moisture and/or air. The first capping layer CL1 may include an inorganic material.

The bank layer 600 may be disposed on the first capping layer CL1. The bank layer 600 may include an organic material. In some cases, the bank layer 600 may include a light blocking material to function as a light blocking layer. The light blocking material may include, for example, at least one selected from a black pigment, a black dye, a black particle, and a metal particle.

Openings may be defined in the bank layer 600. For example, a central opening COP may be defined in the bank layer 600. The central opening COP may overlap the central area CA. In an embodiment, central openings COP may overlap the central area CA. For example, a first central opening COP1 may overlap the first central area CA1. A second central opening COP2 may overlap the second central area CA2. A third central opening COP3 may overlap the third central area CA3.

The functional layer 700 may fill the central opening COP. In an embodiment, the functional layer 700 may include quantum dots and/or scatterers. In an embodiment, the functional layer 700 may include a first quantum dot layer 710, a second quantum dot layer 720, and a transmission layer 730.

The first quantum dot layer 710 may overlap the first central area CA1. The first quantum dot layer 710 may fill the first central opening COP1. The first quantum dot layer 710 may overlap the first emission area EA1. The first pixel PX1 may include the first organic light-emitting diode OLED1 and the first quantum dot layer 710.

The first quantum dot layer 710 may convert light of a first wavelength band emitted from the emission layer 220 on the first pixel electrode 210R into light of a second wavelength band. For example, in case that light of a wavelength belonging to a range of about 450 nm to about 495 nm is emitted from the emission layer 220 on the first pixel electrode 210R, the first quantum dot layer 710 may convert the light into light of a wavelength belonging to a range of about 630 nm to about 780 nm. Accordingly, in the first pixel PX1, the light of a wavelength belonging to a range of about 630 nm to about 780 nm may be emitted to the outside through the upper substrate 400. In an embodiment, the first quantum dot layer 710 may include a first quantum dot QD1, a first scatterer SC1, and a first base resin BR1. The first quantum dot QD1 and the first scatterer SC1 may be dispersed in the first base resin BR1.

The second quantum dot layer 720 may overlap the second central area CA2. The second quantum dot layer 720 may fill the second central opening COP2. The second quantum dot layer 720 may overlap the second emission area EA2. The second pixel PX2 may include the second organic light-emitting diode OLED2 and the second quantum dot layer 720.

The second quantum dot layer 720 may convert light of a first wavelength band emitted from the emission layer 220 on the second pixel electrode 210G into light of a third wavelength band. For example, in case that light of a wavelength belonging to a range of about 450 nm to about 495 nm is emitted from the emission layer 220 on the second pixel electrode 210G, the second quantum dot layer 720 may convert the light into light of a wavelength belonging to a range of about 495 nm to about 570 nm. Accordingly, in the second pixel PX2, the light of a wavelength belonging to a range of about 495 nm to about 570 nm may be emitted to the outside through the upper substrate 400. In an embodiment, the second quantum dot layer 720 may include a second quantum dot QD2, a second scatterer SC2, and a second base resin BR2. The second quantum dot QD2 and the second scatterer SC2 may be dispersed in the second base resin BR2.

The transmission layer 730 may overlap the third central area CA3. The transmission layer 730 may fill the third central opening COP3. The transmission layer 730 may overlap the third emission area EA3. The third pixel PX3 may include the third organic light-emitting diode OLED3 and the transmission layer 730.

Light from the emission layer 220 on the third pixel electrode 210B may be emitted through the transmission layer 730 to the outside without wavelength conversion. For example, in case that light of a wavelength belonging to a range of about 450 nm to about 495 nm is emitted from the emission layer 220 on the third pixel electrode 210B, the light may be emitted through the transmission layer 730 to the outside without wavelength conversion. In an embodiment, the transmission layer 730 may include a third scatterer SC3 and a third base resin BR3. The third scatterer SC3 may be dispersed in the third base resin BR3. In an embodiment, the transmission layer 730 may not include quantum dots.

The first quantum dot QD1 and/or the second quantum dot QD2 may include a semiconductor material such as cadmium sulfide (CdS), cadmium telluride (CdTe), zinc sulfide (ZnS), or indium phosphide (InP). The size of the quantum dot may be several nanometers, and the wavelength of light after conversion may vary according to the size of the quantum dot.

In an embodiment, a core of the quantum dot may be selected from a Group II-VI compound, a Group III-V compound, a Group IV-VI compound, a Group IV element, a Group IV compound, and any combination thereof.

The Group II-VI compound may be selected from: a binary compound selected from CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-V compound may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, and any mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The Group IV-IV compound may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The group IV element may be selected from Si, Ge, and any mixture thereof. The group IV compound may be a binary compound selected from SiC, SiGe, and any mixture thereof.

The binary compound, the ternary compound, or the quaternary compound may be present in particles at a uniform concentration, or may be present in the same particles in a state in which the concentration distributions are partially different from each other. The quantum dot may have a core/shell structure in which one quantum dot surrounds another quantum dot. An interface between the core and the shell may have a concentration gradient in which the concentration of the element present in the shell decreases toward the center thereof.

In an embodiment, the quantum dot may have a core/shell structure that may include a core including nanocrystals described above and a shell surrounding the core. The shell of the quantum dot may act as a protective layer that maintains semiconductor properties by preventing chemical modification of the core and/or a charging layer that imparts electrophoretic properties to the quantum dot. The shell may be single-layer or layers. An interface between the core and the shell may have a concentration gradient in which the concentration of the element present in the shell decreases toward the center thereof. Examples of the shell of the quantum dot may include a metal or non-metal oxide, a semiconductor compound, or any combination thereof.

Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$. However, the disclosure is not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb. However, the disclosure is not limited thereto.

The quantum dot may have a full width of half maximum (FWHM) of an emission wavelength spectrum in a range of about 45 nm or less, about 40 nm or less, and about 30 nm or less. In this range, color purity or color reproducibility may be improved. Because light emitted from the quantum dots is emitted in all directions, a viewing angle may be improved.

The quantum dots may have a form generally used in the art. The form of the quantum dots is not particularly limited. By way of example, as the quantum dots, spherical, pyramidal, multi-arm, or cubic nanoparticles, nanotubes, nanowires, nanofibers, or nanoplatelet may be used.

The quantum dots may control the colors of emitted light according to the particle sizes thereof. Accordingly, the quantum dots may have various emission colors such as blue, red, and green.

The first scatterer SC1, the second scatterer SC2, and the third scatterer SC3 may scatter light so that more light is emitted. The first scatterer SC1, the second scatterer SC2, and the third scatterer SC3 may increase light output efficiency. At least one of the first scatterer SC1, the second scatterer SC2, and the third scatterer SC3 may include a metal or a metal oxide for evenly scattering light. For example, at least one of the first scatterer SC1, the second scatterer SC2, and the third scatterer SC3 may include at least one of $TiO_2$, $ZrO_2$, $Al_2O_3$, $In_2O_3$, ZnO, $SnO_2$, $Sb_2O_3$, and ITO. At least one of the first scatterer SC1, the second scatterer SC2, and the third scatterer SC3 may have a refractive index of 1.5 or more. Accordingly, the light output efficiency of the functional layer 700 may be improved. In an embodiment, at least one of the first scatterer SC1, the second scatterer SC2, and the third scatterer SC3 may be omitted.

The first base resin BR1, the second base resin BR2, and the third base resin BR3 may be a light-transmitting material. For example, at least one of the first base resin BR1, the second base resin BR2, and the third base resin BR3 may include a polymer resin such as acryl resin, BCB or HMDSO.

The second capping layer CL2 may be disposed on the bank layer 600 and the functional layer 700. The second capping layer CL2 may protect the bank layer 600 and the functional layer 700. The second capping layer CL2 may prevent or reduce damage or contamination of the bank layer 600 and/or the functional layer 700 due to infiltration of impurities such as external moisture and/or air. The second capping layer CL2 may include an inorganic material.

In an embodiment, a spacer (not illustrated) may be further disposed on the second capping layer CL2. The spacer may maintain a gap between the display panel 10 and the color conversion panel 20.

In the display device 1, the first pixel PX1 may emit the light of the second wavelength band to the outside, the second pixel PX2 may emit the light of the third wavelength band to the outside, and the third pixel PX3 may emit the light of the first wavelength band to the outside. For example, the display device 1 may display a full-color image.

Figure 4:
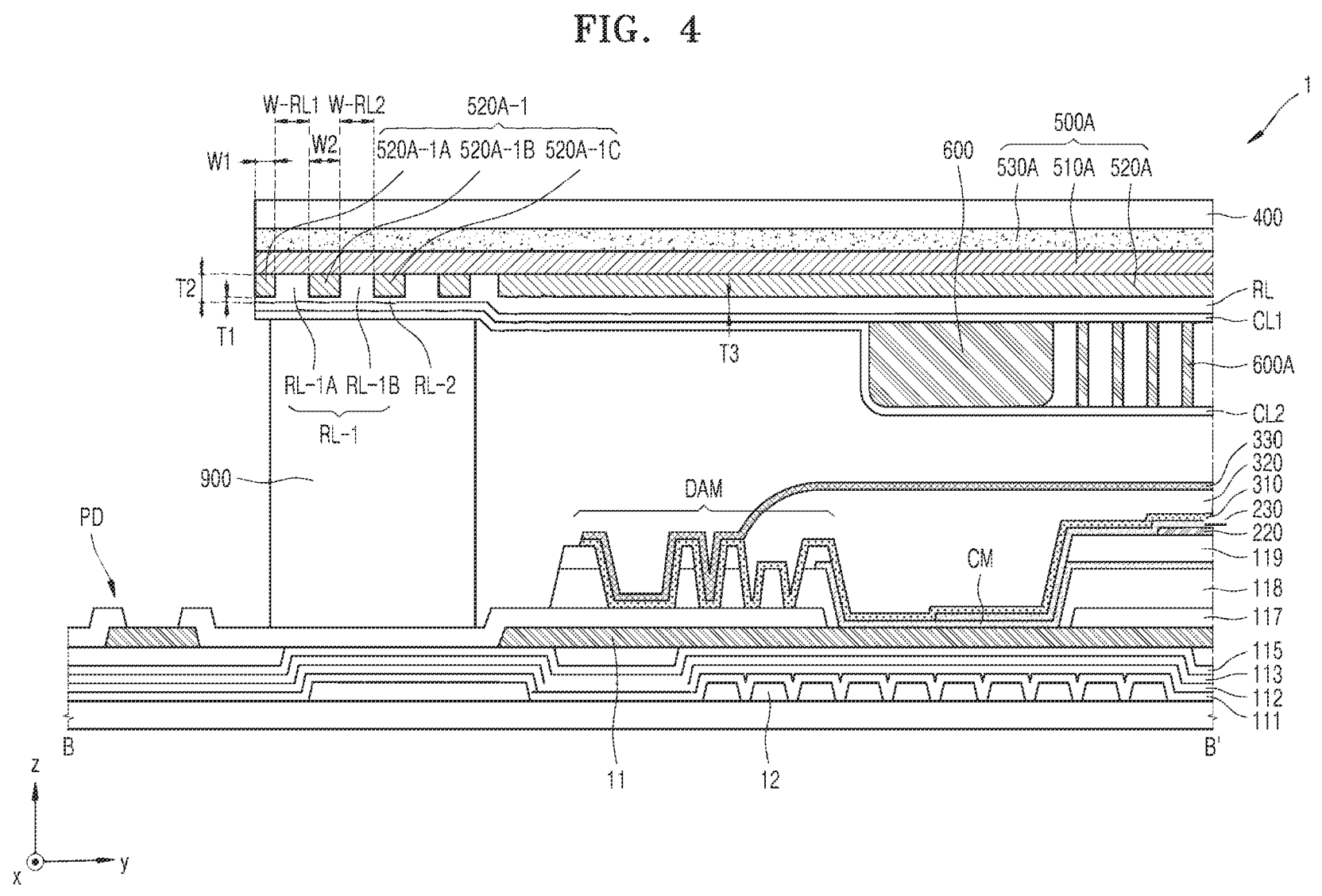
Figure 5:
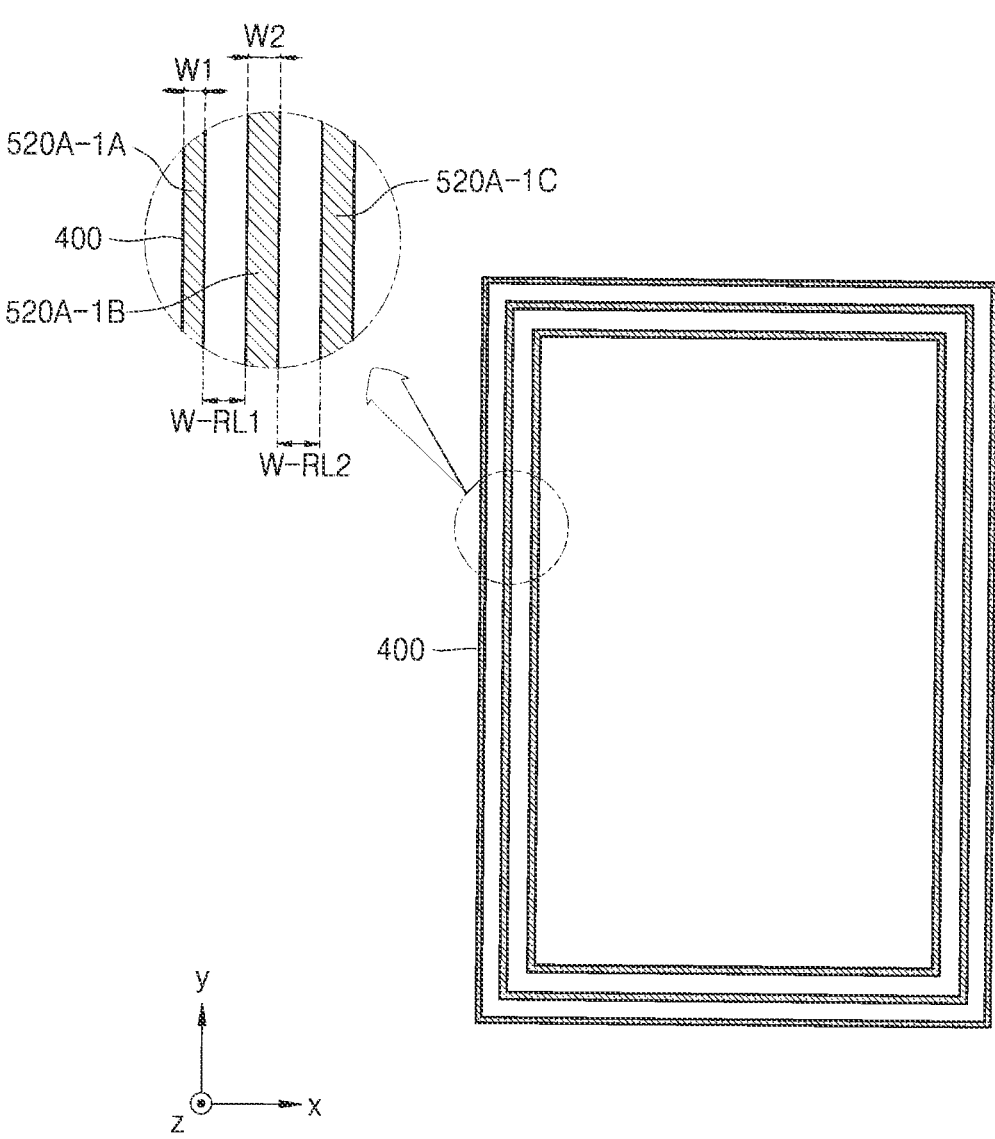
FIG. 5 is a rear view illustrating a lower surface of an upper substrate of FIG. 1, according to an embodiment.

FIG. 4 is a schematic cross-sectional view of the display device 1 taken along line B-B' of FIG. 1, according to an embodiment. FIG. 5 is a rear view illustrating the lower surface of the upper substrate 400 of FIG. 1, according to an embodiment. The schematic cross-sectional view illustrated in FIG. 4 is a schematic cross-sectional view illustrating a lower portion of the display device based on FIG. 3.

Referring to FIGS. 4 and 5, the display device 1 may include a dam DAM on the edge of the lower substrate 100 (e.g., see FIG. 3). The dam DAM may be arranged outside the display area DA to define the boundary of the organic encapsulation layer 320 in case that the organic encapsulation layer 320 is formed. At least one dam DAM may be provided. For example, dams DAM may be provided to be apart from each other from the end of the lower substrate 100. The dam DAM may include an insulating layer. For example, the dam DAM may include a same layer as the planarization layer 118 and/or the pixel defining layer 119. The dam DAM may include the wiring protection layer 117. In an embodiment, although not illustrated, the dam DAM may further include a same layer as the spacer disposed on the pixel defining layer 119. In case that the dam DAM may include layers, the height of one of the dams DAM may be different from the height of another one of the dams DAM. For example, the height of the dam DAM closer to the end of the lower substrate 100 among the dams DAM may be greater than the height of another one of the dams DAM.

The display device 1 may include wiring parts 12 between the lower substrate 100 and the first buffer layer 111. The wiring part 12 may include a fan-out line. The wiring part 12 may be between the first buffer layer 111 and the second buffer layer 112 in addition to the above-described position. In an embodiment, some or a number of wiring parts 12 may be disposed between the first buffer layer 111 and the lower substrate 100, and other wiring parts 12 may be disposed between the first buffer layer 111 and the second buffer layer 112.

The display device 1 may include a driving voltage supply line 11. The driving voltage supply line 11 may extend to the non-display area NDA. The display device 1 may include a connection line CM connected to the driving voltage supply line 11. The connection line CM may be connected to the driving voltage supply line 11, and an extension portion of the opposite electrode 230 may be disposed on the connection line CM.

The display device 1 may include a pad PD. The pad PD may include a pad electrode exposed to the outside. A flexible circuit board or the like arranged in the outside may be in contact with the pad PD and connected thereto. The pad PD may be connected to the driving voltage supply line 11, the wiring part 12, and the like within the spirit and the scope of the disclosure. The pad PD may include terminals.

The bank layer 600 may also be arranged outside the display area DA of the display device 1. The bank layer 600 may include a dummy bank layer 600A in which a dummy layer arranged outside the display area DA is formed. The dummy bank layer 600A may be arranged outside the display area DA. The dummy bank layer 600A may be disposed so as not to overlap the organic light-emitting element described with reference to FIG. 3. The dummy bank layer 600A may include openings as described above. At least one of the color conversion layers (see the first quantum dot QD1 and the second quantum dot QD2 of FIG.

3) and the transmission layer (see the transmission layer 730 of FIG. 3) may be arranged in each of the openings. For example, the transmission layer 730 may be disposed in each of the openings.

The display device 1 may include an edge color filter part 500A on the edge of the display device 1. The edge color filter part 500A may include stacked color filters. Because the color filters are sequentially stacked, a portion of the upper substrate 400 in which the edge color filter part 500A is arranged does not transmit light, and thus, may become an area that is not visually recognized.

The edge color filter part 500A may include a third edge color filter 530A, a first edge color filter 510A, and a second edge color filter 520A, which may be stacked from the upper substrate 400. The first edge color filter 510A, the second edge color filter 520A, and the third edge color filter 530A may include the same materials (or similar material) as the first color filter 510, the second color filter 520, and the third color filter 530, respectively. The third edge color filter 530A may transmit only blue light, the first edge color filter 510A may transmit only red light, and the second edge color filter 520A may transmit only green light. In an embodiment, the third edge color filter 530A and the first edge color filter 510A may include the same materials (or similar materials) as the first color filter 510 and the third color filter 530, respectively.

The second edge color filter 520A may have a concave/convex (concave or convex) portion. For example, the second edge color filter 520A may include an insertion groove adjacent to the end of the lower substrate 100. At least one insertion groove may be provided. In case that insertion grooves are provided, the insertion grooves may be apart from each other. A portion of the second edge color filter 520A may be between the insertion grooves. The insertion groove may form a closed loop along the circumference of the upper substrate 400. A portion of the upper substrate 400 corresponding to the display area DA of the display panel 10 may be arranged inside the insertion groove.

A second edge color filter protrusion 520A-1 may be arranged at the boundary of the insertion groove. The second edge color filter protrusion 520A-1 may form the boundary of the insertion groove. Similar to the insertion groove, the second edge color filter protrusion 520A-1 may form a closed loop. Second edge color filter protrusions 520A-1 may be provided. The second edge color filter protrusions 520A-1 may be apart from each other. For example, as illustrated in FIG. 5, one of the second edge color filter protrusions 520A-1 may be arranged inside the planar shape formed by another one of the second edge color filter protrusions 520A-1. The widths of the second edge color filter protrusions 520A-1 may be equal to or different from each other. For example, the second edge color filter protrusions 520A-1 may include a (2-1)th edge color filter protrusion 520A-1A, a (2-2)th edge color filter protrusions 520A-1B, and a (2-3)th edge color filter protrusion 520A-1C, which are sequentially arranged from the end of the upper substrate 400. A first width W1 of the (2-1)th edge color filter protrusion 520A-1A measured in a first direction (for example, a y-axis direction in FIG. 4) may be different from a second width W2 of the (2-2)th edge color filter protrusion 520A-1B. For example, the first width W1 may be less than the second width W2. A third width of the (2-3)th edge color filter protrusion 520A-1C may be equal to the second width W2.

The refractive layer RL may be disposed on the edge color filter part 500A. Because the refractive layer RL is the same as that described with reference to FIG. 3, a detailed description thereof is omitted. The refractive layer RL may include a protrusion RL-1 and a connection part RL-2. The protrusion RL-1 may be disposed to correspond to the insertion grooves and may be between the insertion grooves. In case that there are insertion grooves, protrusions RL-1 may be provided to correspond to the number of insertion grooves. The connection part RL-2 may be between the protrusions RL-1 adjacent to each other among the protrusions RL-1 to connect the protrusions RL-1 adjacent to each other. Because a groove is provided between the protrusions RL-1 adjacent to each other, the second edge color filter protrusions 520A-1 may be inserted into the groove.

A second thickness T2 of the protrusion RL-1 may be different from a first thickness T1 of the connection part RL-2. For example, the second thickness T2 may be greater than the first thickness T1. At this time, the thickness may be measured in a z-axis direction in FIG. 4. Because the thickness of the refractive layer RL arranged at the end of the upper substrate 400 is different, moisture penetrating through the refractive layer RL may be blocked. For example, because the refractive layer RL is formed to have a different thickness, the movement path of the moisture penetrating into the end of the refractive layer RL increases due to the concave/convex portion of the refractive layer RL, and the passage rate of moisture may decrease at the side of the connection part RL-2 having a thickness less than those of other portions. Accordingly, the lifespan of the display device 1 may be increased by reducing moisture penetrating from the outside through the refractive layer RL.

Protrusions RL-1 may be provided. The width of the protrusion RL-1 may be equal to or similar to the width of the insertion groove. For example, a first protrusion width W-RL1 of a first protrusion RL-1A among the protrusions RL-1 may be equal to a second protrusion width W-RL2 of a second protrusion RL-1B among the protrusions RL-1.

On the other hand, in addition to the refractive layer RL on the edge color filter part 500A, the first capping layer CL1 and/or the second capping layer CL2 may be disposed on the refractive layer RL. For example, the first capping layer CL1 and/or the second capping layer CL2 may extend from a portion of the upper substrate 400 corresponding to the display area DA of the display panel 10 to the end of the upper substrate 400. As a result, one surface or a surface of the refractive layer RL may be shielded. The first capping layer CL1 and/or the second capping layer CL2 may include an inorganic insulating material such as silicon oxide, silicon nitride, and/or silicon oxynitride.

The sealing part 900 may be disposed on the edge color filter part 500A. The sealing part 900 may be disposed to overlap the protrusion and the groove of the second edge color filter 520A and/or the refractive layer RL. For example, the sealing part 900 may be disposed to overlap at least one of the insertion grooves. The sealing part 900 may be disposed to overlap at least one of the protrusions RL-1.

Figure 6:
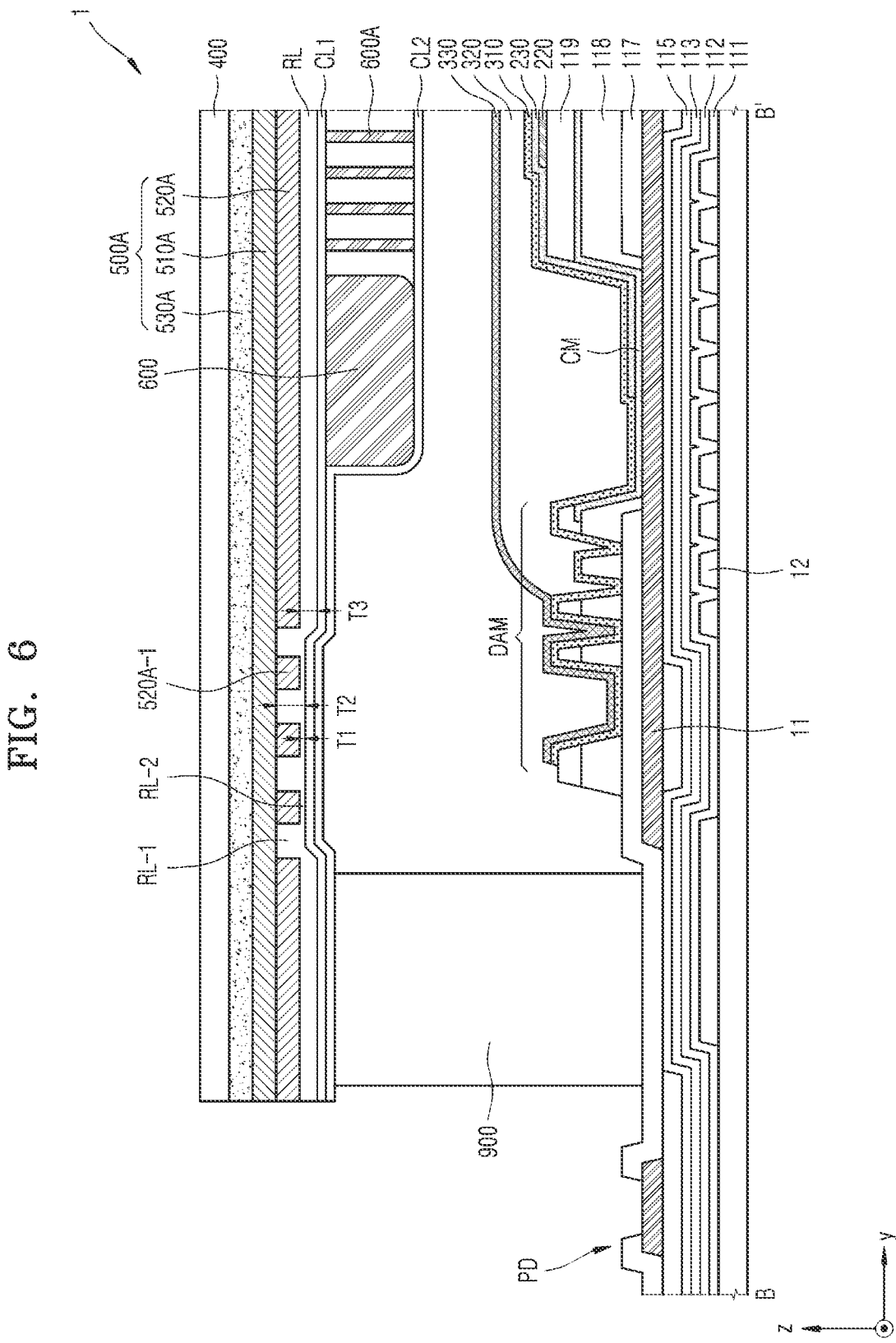
FIG. 6 is a schematic cross-sectional view schematically illustrating a display device according to an embodiment.

FIG. 6 is a schematic cross-sectional view schematically illustrating a display device 1 according to an embodiment. The display device 1 of FIG. 6 may be the same as or similar to the display device of FIG. 5 (and/or FIG. 4). Hereinafter, for convenience of description, parts different from those of FIG. 5 (and/or FIG. 4) will be described in detail. The same reference numerals as those in FIG. 5 (and/or FIG. 4) denote the same members.

Referring to FIG. 6, the display device 1 may include an edge color filter part 500A. A concave/convex portion of the edge color filter part 500A may be arranged in an inner space defined by a sealing part 900, a display panel 10, and a color conversion panel 20. Because the concave/convex portion of the edge color filter part 500A is the same as or similar to that described with reference to FIG. 5, a detailed description thereof is omitted.

The sealing part 900 may be disposed on a portion of a second edge color filter 520A without a concave/convex portion. The concave/convex portion of the second edge color filter 520A may be arranged further away from the end of the upper substrate 400 than the sealing part 900.

A refractive layer RL may be disposed on the second edge color filter 520A. A first capping layer CL1 and/or a second capping layer CL2 may be disposed on the refractive layer RL that is disposed on the second edge color filter 520A.

Accordingly, in the display device 1, moisture introduced through the refractive layer RL may be reduced by the concave/convex portion of the edge color filter part 500A.

Figure 7:
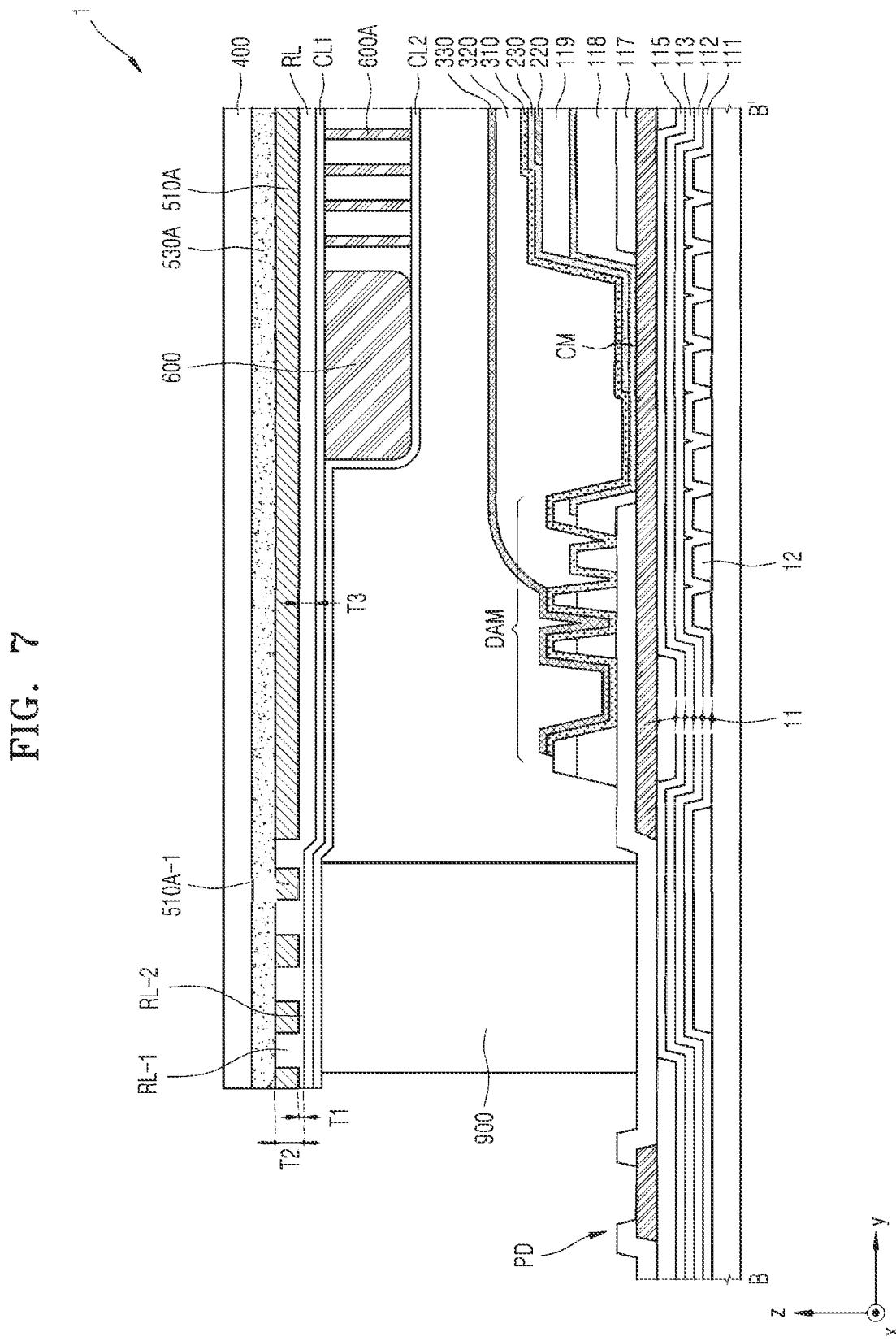
FIG. 7 is a schematic cross-sectional view schematically illustrating a display device according to an embodiment.

FIG. 7 is a schematic cross-sectional view schematically illustrating a display device 1 according to an embodiment. The display device 1 of FIG. 7 may be the same as or similar to the display device of FIG. 5 (and/or FIG. 4). Hereinafter, for convenience of description, parts different from those of FIG. 5 (and/or FIG. 4) will be described in detail. The same reference numerals as those in FIG. 5 (and/or FIG. 4) denote the same members.

Referring to FIG. 7, the display device 1 may include an edge color filter part 500A. The edge color filter part 500A may include a third edge color filter 530A and a first edge color filter 510A. One of the third edge color filter 530A and the first edge color filter 510A may include the same material (or similar material) as that of a third color filter 530. The other one of the third edge color filter 530A and the first edge color filter 510A may include the same material (or similar material) as that of a first color filter 510. Hereinafter, for convenience of description, a case in which the first edge color filter 510A may include the same material (or similar material) as that of the first color filter 510 and the third edge color filter 530A may include the same material (or similar material) as that of the third color filter 530 will be described in detail.

The edge color filter part 500A may include a concave/convex portion. The concave/convex portion of the edge color filter part 500A may be formed in the first edge color filter 510A. Because the shape of the concave/convex portion of the first edge color filter 510A is similar to the shape of the concave/convex portion of the second edge color filter 520A illustrated in FIGS. 4 and 5, a detailed description thereof is omitted.

A refractive layer RL may be disposed on the edge color filter part 500A. A first capping layer CL1 and/or a second capping layer CL2 may be disposed on the refractive layer RL. The concave/convex portion of the edge color filter part 500A may be disposed to overlap a position of a sealing part 900 in a plan view.

Accordingly, in the display device 1, moisture introduced through the refractive layer RL may be reduced by the concave/convex portion of the edge color filter part 500A.

Figure 8:
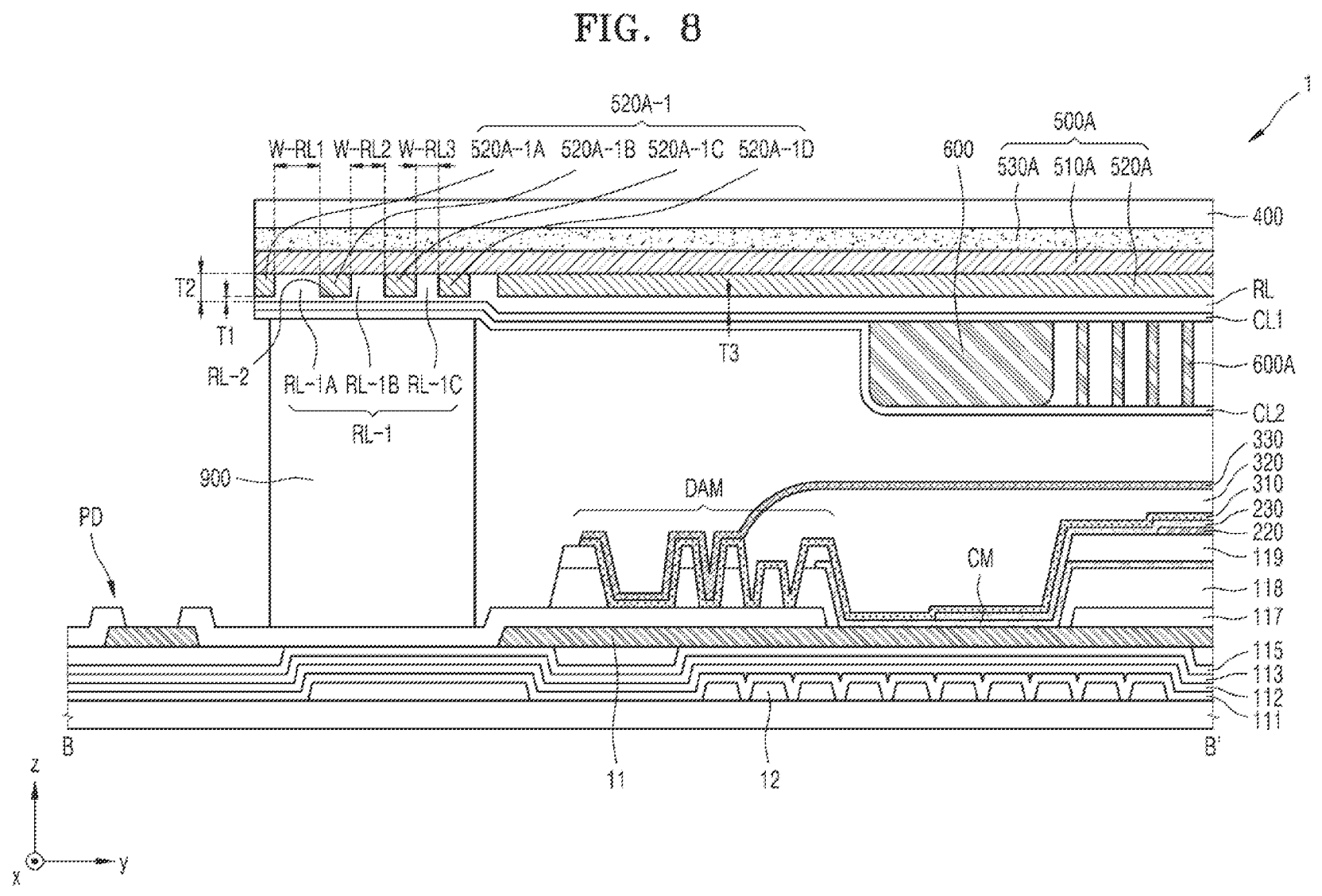
Figure 9:
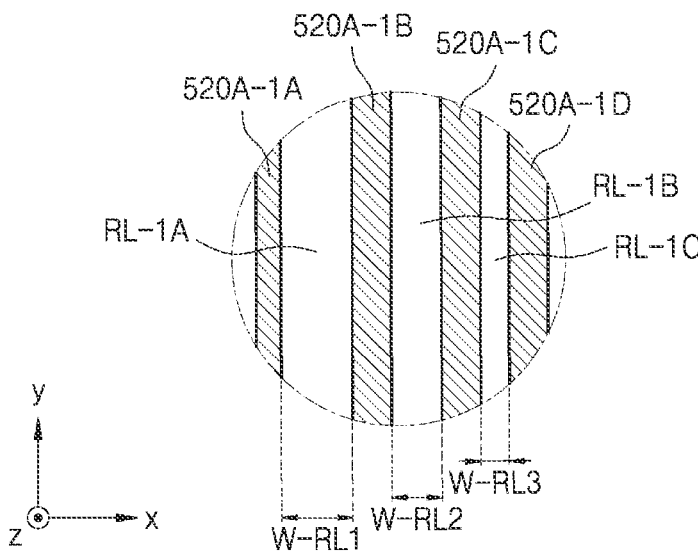
FIG. 9 is a rear view schematically illustrating a portion of an upper substrate of FIG. 8, according to an embodiment.

FIG. 8 is a schematic cross-sectional view schematically illustrating a display device 1 according to an embodiment. FIG. 9 is a rear view schematically illustrating a portion of an upper substrate of FIG. 8, according to an embodiment. The display device 1 of FIG. 9 may be similar to the display device of FIG. 5 (and/or FIG. 4). Hereinafter, for convenience of description, parts different from those of FIG. 5 (and/or FIG. 4) will be described in detail. The same reference numerals as those in FIG. 5 (and/or FIG. 4) denote the same members.

Referring to FIGS. 8 and 9, the display device 1 may include an edge color filter part 500A, and the edge color filter part 500A may include a concave/convex portion. The edge color filter part 500A may include a first edge color filter 510A, a second edge color filter 520A, and a third edge color filter 530A. The first edge color filter 510A, the second edge color filter 520A, and the third edge color filter 530A may include the same materials (or similar material) as those of a first color filter 510, a second color filter 520, and a third color filter 530, respectively. In an embodiment, the first edge color filter 510A, the second edge color filter 520A, and the third edge color filter 530A may include the same materials (or similar materials) as those of the third color filter 530, the second color filter 520, and the first color filter 510, respectively. The second edge color filter 520A may include second edge color filter protrusions 520A-1. For example, the second edge color filter protrusions 520A-1 may include a (2-1)th edge color filter protrusion 520A-1A, a (2-2)th edge color filter protrusion 520A-1B, a (2-3)th edge color filter protrusion 520A-1C, and a (2-4)th edge color filter protrusion 520A-1D. A first width of the (2-1)th edge color filter protrusion 520A-1A measured in a first direction (for example, a y-axis direction in FIG. 8) may be different from a second width of the (2-2)th edge color filter protrusion 520A-1B. For example, the first width may be greater than the second width.

An insertion groove may be between the second edge color filter protrusions 520A-1. A protrusion RL-1 of a refractive layer RL may be inserted into the insertion groove. Two or more protrusions RL-1 may be provided. For example, the protrusions RL-1 may include a first protrusion RL-1A, a second protrusion RL-1B, a third protrusion RL-1C, and a fourth protrusion (not indicated), which are sequentially arranged from the end of the upper substrate 400.

The widths of the protrusions RL-1 measured in the first direction may be different from each other. For example, one of a first protrusion width W-RL1 of the first protrusion RL-1A, a second protrusion width W-RL2 of the second protrusion RL-1B, a third protrusion width W-RL3 of the third protrusion RL-1C, and a fourth protrusion width (not indicated) of the fourth protrusion may be different from another one of the first protrusion width W-RL1 of the first protrusion RL-1A, the second protrusion width W-RL2 of the second protrusion RL-1B, the third protrusion width W-RL3 of the third protrusion RL-1C, and the fourth protrusion width (not indicated) of the fourth protrusion. For example, the first protrusion width W-RL1, the second protrusion width W-RL2, and the third protrusion width W-RL3 may be sequentially decreased. The first protrusion width W-RL1 is formed to be the greatest. Accordingly, in case that moisture penetrates through the end of the refractive layer RL from the outside where the end of the upper substrate 400 is arranged, the moisture penetration path may be maintained as long as possible. The thickness of the refractive layer RL through which the moisture penetrates may be minimized by sequentially decreasing the second protrusion width W-RL2 and the third protrusion width W-RL3.

As described above, the first capping layer CL1 and/or the second capping layer CL2 may be disposed on the refractive layer RL. For example, although not illustrated, the first capping layer CL1 or the second capping layer CL2 may be disposed on the refractive layer RL, or the first capping layer CL1 and the second capping layer CL2 may be disposed on the refractive layer RL.

A sealing part 900 may be disposed to correspond to the edge color filter part 500A, so that the display panel and the color conversion panel may be bonded to each other.

Accordingly, in the display device 1, moisture introduced through the refractive layer RL may be reduced by the concave/convex portion of the edge color filter part 500A.

The protrusion widths of the protrusions RL-1 are not limited the above example. For example, in case that protrusions RL-1 are provided, the protrusion widths of some or a number of protrusions RL-1 may be equal to each other, and the protrusion widths of other protrusions RL-1 may have the same tendency as described above. Some or a number of protrusions RL-1 having the same protrusion width may be arranged closer to the end of the upper substrate 400 than other protrusions RL-1.

Figure 10:
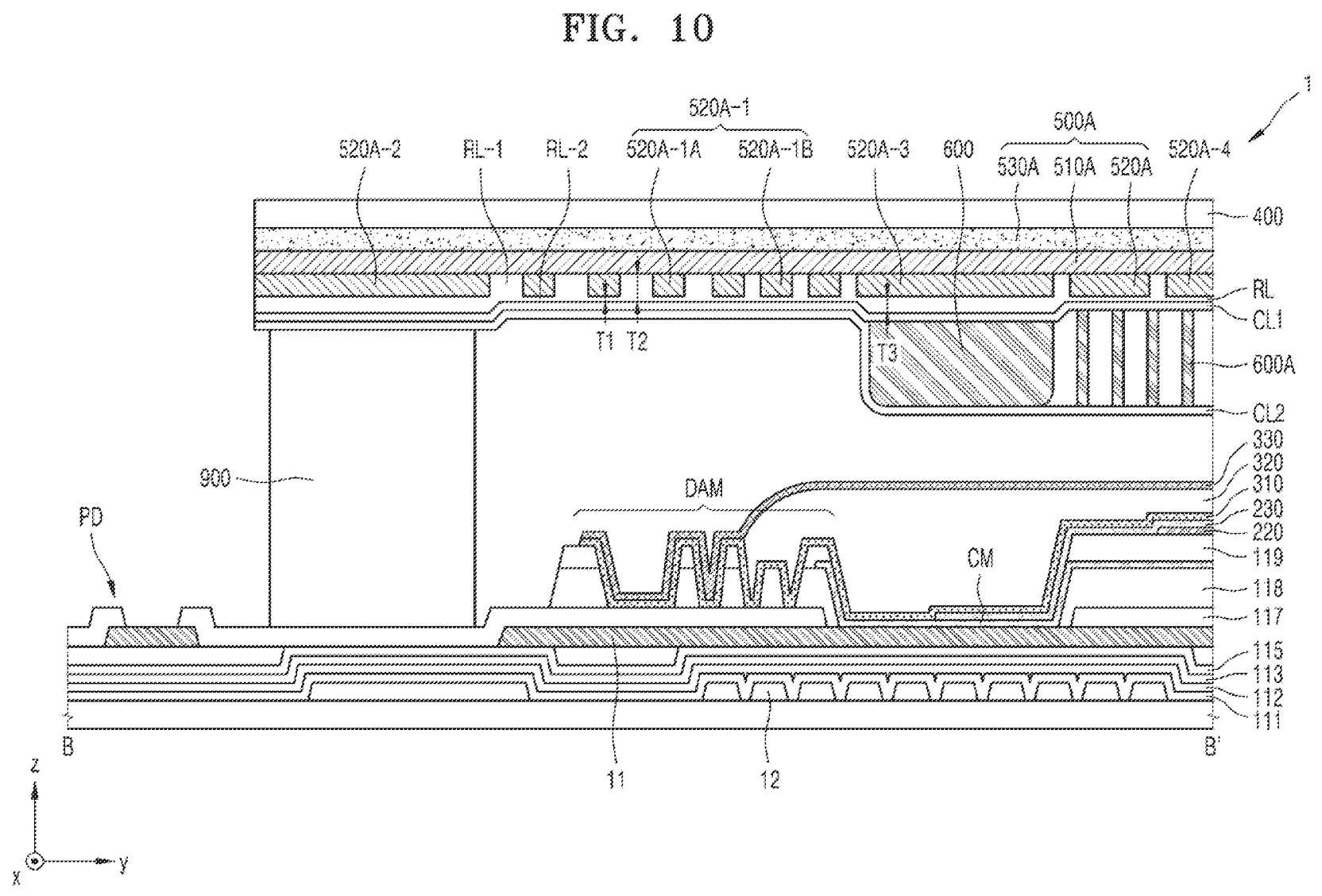
Figure 11:
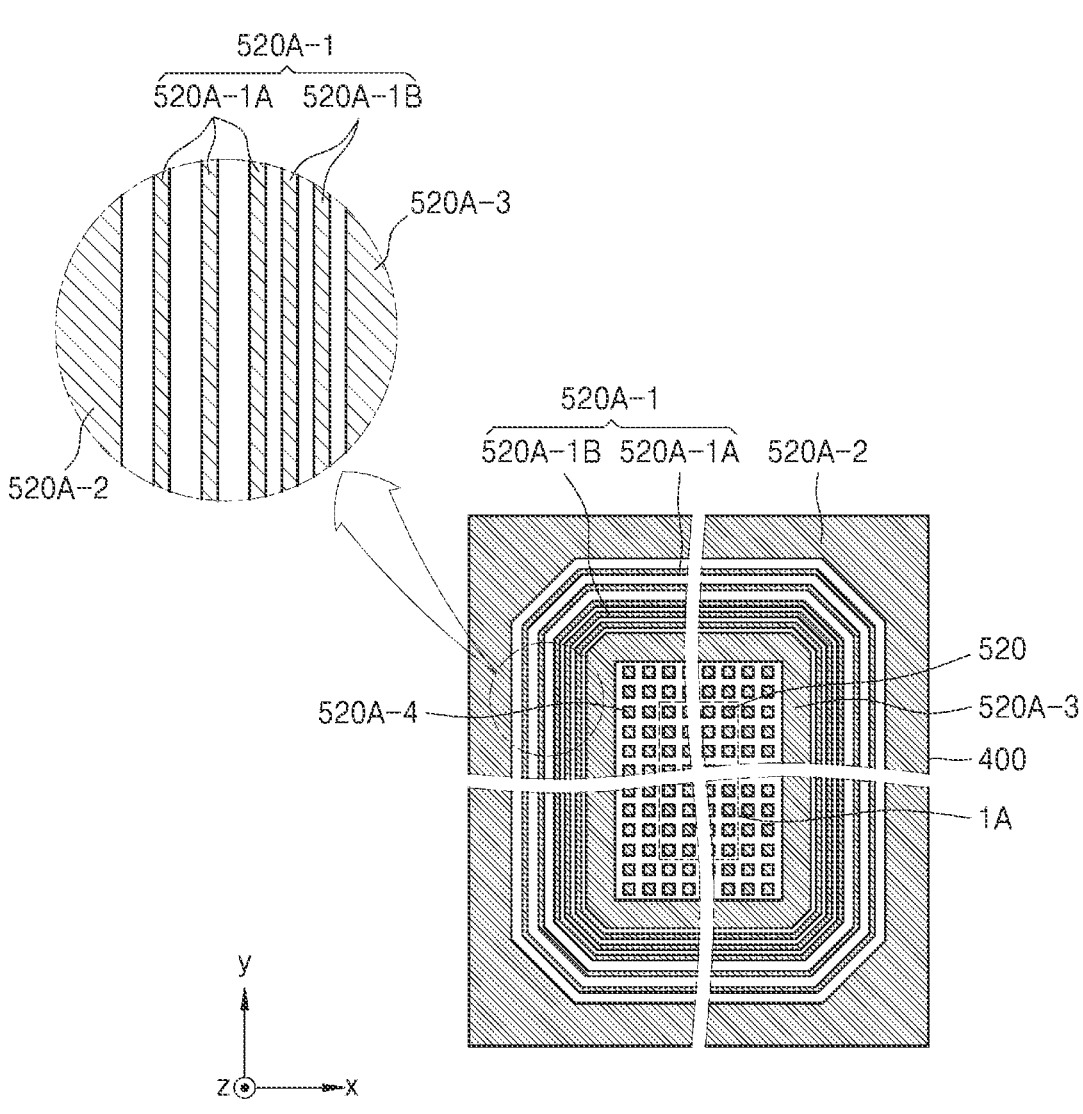
FIG. 11 is a schematic plan view schematically illustrating a second edge color filter, a second dummy color filter, and a second color filter, which are disposed on an upper substrate of FIG. 10, according to an embodiment.

FIG. 10 is a schematic cross-sectional view schematically illustrating a display device 1 according to an embodiment. FIG. 11 is a schematic plan view schematically illustrating a second edge color filter, a second dummy color filter, and a second color filter, which are disposed on an upper substrate 400 of FIG. 10, according to an embodiment. The display device 1 of FIG. 10 may be similar to the display device of FIG. 5 (and/or FIG. 4). Hereinafter, for convenience of description, parts different from those of FIG. 5 (and/or FIG. 4) will be described in detail. The same reference numerals as those in FIG. 5 (and/or FIG. 4) denote the same members.

Referring to FIGS. 10 and 11, the display device 1 may include an edge color filter part 500A on the edge of the display device 1. The edge color filter part 500A may include stacked color filters. Because the color filters are sequentially stacked, a portion of the upper substrate 400 in which the edge color filter part 500A is arranged does not transmit light, and thus, may become an area that is not visually recognized.

The edge color filter part 500A may include a third edge color filter 530A, a first edge color filter 510A, and a second edge color filter 520A, which may be stacked from the upper substrate 400. The first edge color filter 510A, the second edge color filter 520A, and the third edge color filter 530A may include the same materials (or similar materials) as those of a first color filter 510, a second color filter 520, and a third color filter 530, respectively. The third edge color filter 530A may transmit only blue light, the first edge color filter 510A may transmit only red light, and the second edge color filter 520A may transmit only green light. In an embodiment, the third edge color filter 530A and the first edge color filter 510A may include the same materials (or similar materials) as those of the first color filter 510 and the third color filter 530, respectively.

The second edge color filter 520A may have a concave/convex portion. The second edge color filter 520A may include second edge color filter protrusions 520A-1. For example, the second edge color filter protrusion 520A-1 may include (2-1)th edge color filter protrusions 520A-1A that are apart from each other. The widths of the (2-1)th edge color filter protrusions 520A-1A measured in the first direction or a second direction (for example, a x-axis direction in FIG. 5) may be equal to each other. In an embodiment, the widths of the (2-1)th edge color filter protrusions 520A-1A measured in the first direction or the second direction may be different from each other. Hereinafter, for convenience of description, a case in which the widths of the (2-1)th edge color filter protrusions 520A-1A measured in the first direction or the second direction will be described in detail.

A groove may be between the (2-1)th edge color filter protrusions 520A-1A adjacent to each other among the (2-1)th edge color filter protrusions 520A-1A that are apart from each other. At this time, the groove between the (2-1)th edge color filter protrusion 520A-1A and the (2-1)th edge color filter protrusion 520A-1A adjacent to each other may form a closed loop along the edge of the upper substrate 400.

The second edge color filter protrusion 520A-1 may include (2-2)th edge color filter protrusions 520A-1B arranged closer to the display area (see the display area DA of FIG. 1) than the (2-1)th edge color filter protrusions 520A-1A. The widths of the (2-2)th edge color filter protrusions 520A-1B measured in the first direction or the second direction may be equal to or different from each other. A groove may be between the (2-2)th edge color filter protrusions 520A-1B adjacent to each other. The width of the groove between the (2-1)th edge color filter protrusions 520A-1A adjacent to each other may be different from the width of the groove between the (2-2)th edge color filter protrusions 520A-1B adjacent to each other. For example, the width of the groove between the (2-1)th edge color filter protrusions 520A-1A adjacent to each other may be greater than the width of the groove between the (2-2)th edge color filter protrusions 520A-1B adjacent to each other. Therefore, the path through which external moisture or oxygen moves through the refractive layer RL is formed as long as possible, so that introduction of external moisture or oxygen through the refractive layer RL may be minimized.

The second edge color filter 520A may include second support color filters 520A-2 arranged outside the (2-1)th edge color filter protrusion 520A-1A. The second support color filters 520A-2 may be integrally provided, and a portion thereof in contact with the sealing part 900 may be maintained flat.

The second edge color filter 520A may include a second boundary color filter 520A-3 and a second dummy color filter 520A-4, which are arranged at a boundary with a second color filter 520 (see FIG. 11). The width of the second boundary color filter 520A-3 may be different from the width of the (2-1)th edge color filter protrusion 520A-1A or the width of the (2-2)th edge color filter protrusion 520A-1B.

The second dummy color filter 520A-4 may be disposed to surround the outer edge of the second color filter 520. Second dummy color filters 520A-4 may be provided. The second dummy color filters 520A-4 may be apart from each other. For example, the second dummy color filters 520A-4 may be apart from each other in the first direction or the second direction. The distance between the second dummy color filters 520A-4 adjacent to each other may be equal to or similar to the distance between the second color filters 520 adjacent to each other.

The second color filter 520 may be arranged inside a first area 1A. The first area 1A may be an area corresponding to the display area DA described above. The second color filters 520 may be apart from each other, and may be disposed to correspond to the second pixel PX2 described above.

A refractive layer RL may be disposed on the second edge color filter 520A and the second color filter 520. The refractive layer RL may include protrusions RL-1 disposed on the groove between the (2-1)th edge color filter protrusions 520A-1A and the groove between the (2-2)th edge color filter protrusions 520A-1B, and connection parts RL-2 connecting the protrusions RL-1. A second thickness T2 of the protrusion RL-1 may be different from a second thickness T2 of the connection part RL-2. For example, the second thickness T2 may be greater than the first thickness T1. Also, a third thickness T3 of the connection part RL-2 between the second boundary color filter 520A-3 and the bank layer 600 may be different from the first thickness T1 and the second thickness T2. For example, the third thickness T3 may be between the first thickness Ti and the second thickness T2.

On the other hand, the first edge color filter 510A and the third edge color filter 530A may be formed differently from the second edge color filter 520A. For example, although not illustrated, the first edge color filter 510A and the third edge color filter 530A are integrally provided from the area where the second dummy color filter 520A-4 is arranged to the second support color filter 520A-2. In an embodiment, although not illustrated, the first edge color filter 510A and the third edge color filter 530A may include a first dummy color filter (not illustrated) and a third dummy color filter (not illustrated), as the second dummy color filter 520A-4 in the second edge color filter 520A. A portion of the first edge color filter 510A may be integrally provided from the boundary of the first dummy color filter to the end of the upper substrate 400. A portion of the third edge color filter 530A may also be integrally provided from the boundary of the third dummy color filter to the end of the upper substrate 400. The first dummy color filter may be arranged in the same pattern as the first color filter (not illustrated), and the third dummy color filter may be arranged in the same pattern as the third color filter (not illustrated).

The lifespan of the display device according to the embodiments may be increased. The display device according to embodiments may provide a clear image.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display device comprising:
an edge color filter part disposed on an edge of a substrate, the edge color filter part comprising at least two stacked edge color filters; and
a refractive layer disposed on the edge color filter part, wherein
at least one of the edge color filter part and the refractive layer comprises a concave portion, and
the other one of the at least one of the edge color filter part and the refractive layer comprises a protrusion inserted into the concave portion.

2. The display device of claim 1, wherein the edge color filter part comprises at least one insertion groove into which the protrusion is inserted.

3. The display device of claim 2, wherein
the at least one insertion groove comprises insertion grooves spaced apart from each other, and
a first width of one insertion groove among the at least one insertion groove is different from a second width of another insertion groove among the at least one insertion groove.

4. The display device of claim 3, wherein the first width is greater than the second width.

5. The display device of claim 4, wherein the at least one insertion groove having the first width among the insertion grooves is disposed closer to an end of the substrate than the another insertion groove having the second width among the insertion grooves.

6. The display device of claim 2, wherein the at least one insertion groove forms a single closed-loop in a plan view.

7. The display device of claim 1, wherein the refractive layer comprises the protrusion and the edge color filter part comprises the concave portion, and the protrusion in a plan view contacts different edge color filters.

8. The display device of claim 1, wherein the edge color filter part comprises:
a first edge color filter disposed on the substrate and disposed on the edge of the substrate; and
a second edge color filter disposed on the first edge color filter, the second edge color filter defining the concave portion.

9. The display device of claim 8, wherein
the first edge color filter transmits blue light, and
the second edge color filter transmits red light.

10. The display device of claim 1, wherein the edge color filter part comprises:
a first edge color filter disposed on the substrate and disposed on the edge of the substrate;
a second edge color filter disposed on the first edge color filter; and
a third edge color filter disposed on the second edge color filter, the third edge color filter defining the concave portion.

11. The display device of claim 10, wherein
the first edge color filter transmits blue light,
the second edge color filter transmits red light, and
the third edge color filter transmits green light.

12. The display device of claim 1, further comprising:
a capping layer disposed on the refractive layer.

13. The display device of claim 1, further comprising:
a bank layer disposed on the refractive layer.

14. A display device comprising:
an edge color filter part disposed on an edge of a substrate, the edge color filter part comprising at least two stacked edge color filters; and
a refractive layer disposed on the edge color filter part, wherein the refractive layer disposed on the edge color filter part comprises portions of different thicknesses.

15. The display device of claim 14, wherein the refractive layer comprises:
a first portion having a first thickness; and
a second portion having a second thickness different from the first thickness and connected to the first portion of the refractive layer.

16. The display device of claim 15, wherein the edge color filter part comprises a groove in which the first portion is accommodated.

17. The display device of claim 15, wherein
the first portion comprises plural first portions, and
a first width of one first portion among the plural first portions in a first direction is different from a second width of another first portion among the plural first portions.

18. The display device of claim 17, wherein the first width is greater than the second width.

19. The display device of claim 18, wherein the one first portion having the first width among the plural first portions is disposed closer to an end of the substrate than the another first portion among the plural first portions having the second width.

20. The display device of claim 15, wherein the first portion forms a closed loop in a plan view.

21. The display device of claim 14, further comprising:
a capping layer disposed on the refractive layer.

22. The display device of claim 14, wherein the edge color filter part comprises:

a first edge color filter disposed on the substrate and disposed on the edge of the substrate; and a second edge color filter disposed on the first edge color filter, the second edge color filter defining a concave portion.

23. The display device of claim 14, wherein the edge color filter part comprises:

a first edge color filter disposed on the substrate and disposed on the edge of the substrate;

a second edge color filter disposed on the first edge color filter; and a third edge color filter disposed on the second edge color filter, the third edge color filter defining a concave portion.

* * * * *